(12) United States Patent
Leman et al.

(10) Patent No.: US 11,777,433 B2
(45) Date of Patent: Oct. 3, 2023

(54) DRIVER AND METHOD FOR LOW INDUCTANCE MOTOR

(71) Applicant: Melexis Bulgaria Ltd, Sofia (BG)

(72) Inventors: Dirk Leman, Lier (BE); Xing Zuo, ShenZhen (CN)

(73) Assignee: MELEXIS BULGARIA LTD., Sofia (BG)

(*) Notice: Subject to any disclaimer, the term of this patent is extended or adjusted under 35 U.S.C. 154(b) by 432 days.

(21) Appl. No.: 17/177,085

(22) Filed: Feb. 16, 2021

(65) Prior Publication Data

US 2021/0211082 A1    Jul. 8, 2021

Related U.S. Application Data

(63) Continuation-in-part of application No. 15/923,778, filed on Mar. 16, 2018, now Pat. No. 10,965,230.

(51) Int. Cl.
*H02P 25/03* (2016.01)
*H03K 3/017* (2006.01)

(52) U.S. Cl.
CPC ............ *H02P 25/03* (2016.02); *H03K 3/017* (2013.01)

(58) Field of Classification Search
CPC .................................................. H02P 25/03
See application file for complete search history.

(56) References Cited

U.S. PATENT DOCUMENTS

| 4,774,589 | A | 9/1988 | Rowland |
| 5,272,426 | A | 12/1993 | Cook, II |
| 5,406,150 | A | 4/1995 | Austin |
| 5,462,763 | A | 10/1995 | Kondoh |
| 5,663,616 | A | 9/1997 | Stringfellow et al. |
| 7,171,946 | B1 | 2/2007 | Watanabe |
| 10,135,169 | B1 | 11/2018 | Shimoju et al. |
| 10,135,369 | B2 | 11/2018 | Brown et al. |
| 2006/0186846 | A1 | 8/2006 | Lassen |
| 2012/0257317 | A1 | 10/2012 | Abou-Khalil et al. |
| 2013/0253420 | A1 | 9/2013 | Favreau |
| 2013/0257326 | A1 | 10/2013 | Winker et al. |
| 2015/0146455 | A1* | 5/2015 | Engel ................ H02M 3/33507 363/17 |
| 2016/0049890 | A1 | 2/2016 | Mergener et al. |
| 2016/0134225 | A1 | 5/2016 | Ikitake et al. |
| 2018/0083440 | A1 | 3/2018 | Gao et al. |
| 2018/0198388 | A1 | 7/2018 | Kreider et al. |
| 2019/0341867 | A1* | 11/2019 | Taniguchi ............ H02K 21/044 |

* cited by examiner

*Primary Examiner* — Zoheb S Imtiaz
(74) *Attorney, Agent, or Firm* — WORKMAN NYDEGGER

(57) ABSTRACT

A brushless DC motor system, includes a single coil brushless DC motor and a driver for driving the single coil brushless DC motor. The brushless DC motor system has a maximum time constant $\tau_{max}$. The driver comprises a control unit which is adapted for driving the brushless DC motor at a constant speed and at a variable speed by applying a PWM driving signal to the coil of the brushless DC motor with a PWM frequency larger than a ratio defined by a constant/$\tau_{max}$ wherein the ratio is such that a current through the coil is always bigger than a pre-defined undercurrent limit.

16 Claims, 14 Drawing Sheets

10% duty bench test

10% duty zoom (position of lowest current)

20% duty bench test

20% duty zoom (position of lowest current)

30% duty bench test

30% duty zoom (position of lowest current)

40% duty bench test

40% duty zoom (position of lowest current)

50% duty bench test

100% duty bench test

DRIVER AND METHOD FOR LOW INDUCTANCE MOTOR

FIELD OF THE INVENTION

The present invention relates to methods and systems for controlling a brushless DC motor. More specifically it relates to methods and systems for driving a low inductance brushless DC motor.

BACKGROUND OF THE INVENTION

Brushless direct current (BLDC) motors typically comprise a magnetic rotor and one or more stator coils. Such brushless DC motors may for example be used in fans for air cooling purposes or to move any medium (e.g. gases and liquids). Such fans are used in a wide range of applications. Typical BLDC motors are designed based on wire wound coils. Such coils have a typical L/R between 100 µs and 1 ms.

It is known from prior art, that BLDC motors are driven with a PWM frequency in order to control their speed, current or the torque, that they produce. The applied PWM frequencies should be high enough, so that acoustic noise is not in the human audible spectrum and they should be low enough in order to manage switching losses. Further, the PWM should have a certain resolution, what might be in the range of 8 to 10 bit or even 7 bit for low cost single coil fandrivers. Following these constraints, a PWM frequency of 15 kHz to 30 kHz is typically chosen. In applications where reducing switching losses is very important, even lower switching frequencies are applied, as low as 5 kHz or lower. An example of a PWM driven BLDC motor with PWM commutation frequencies of 5 and 20 kHz is described in US2016049890.

A motor control system using 8-bit PWM to control the commutation is described in US20060186846A1.

In BLDC motors the BEMF acts as a torque converter to transfer the electrical power into mechanical power. This BEMF may accelerate the rotor for current flowing through the coil in a given direction and may act as a braking force if current flows in the opposite direction. Such interaction is the main cause for increased acoustic noise and reduced efficiency in low inductance BLDC motors which are driven using a prior art motor driver applying PWM duty cycle control.

In order to avoid such noise/efficiency shortcomings when driving low inductance motors using PWM control, other driving mechanisms are applied. Prior art drivers, such as the Melexis US168 low noise and low voltage single coil fan/motor driver, may for example apply linear control.

Linearly driven motors may, however, be less power efficient that PWM driven motors. There is therefore a need for PWM drivers for driving low inductance brushless DC motors.

SUMMARY OF THE INVENTION

It is an object of embodiments of the present invention to provide a good motor driver and method for driving a low inductance BLDC motor and to provide a good motor system comprising such a motor driver and motor.

The above objective is accomplished by a method and device according to the present invention.

In a first aspect embodiments of the present invention relate to a brushless DC motor system, comprising a single coil brushless DC motor and a driver for driving the single coil brushless DC motor, wherein the brushless DC motor system has a maximum time constant $\tau_{max}$, the driver comprising a control unit which is adapted for driving the brushless DC motor at a constant speed and/or at a variable speed by applying a PWM driving signal to the coil of the brushless DC motor with a PWM frequency larger than a ratio defined by a constant/$\tau_{max}$ wherein the ratio is such that a current through the coil is always bigger than a pre-defined undercurrent limit.

In embodiments of the present invention the constant may be in the range 2 to 20.

In a second aspect embodiments of the present invention relate to a method for controlling a single coil brushless DC motor in a brushless DC motor system which has a maximum time constant $\tau_{max}$, the method comprising applying a PWM driving signal to the coil of the brushless DC motor with a PWM frequency larger than a ratio defined by a constant/$\tau_{max}$ wherein the ratio is such that a current through the coil is always bigger than a pre-defined undercurrent limit.

In embodiments of the present invention the control unit may be adapted for applying a PWM driving signal to the at least one coil of the brushless DC motor such that a current through the at least one coil is always bigger than a pre-defined undercurrent limit. In embodiments of the present invention this is achieved by adjusting a PWM frequency for a given duty cycle.

It is an advantage of embodiments of the present invention that significant breaking of the motor is prevented by controlling the PWM signal such that the current does not go below an undercurrent limit while driving the motor using the PWM driving signal.

In embodiments of the present invention this undercurrent limit may be substantially zero or zero. In embodiments of the present invention the undercurrent limit may be slightly negative as long as the negative current is not causing significant torque ripple which results in mechanical vibrations. The integral of the current through the coil below zero may for example be ten times smaller than the integral of the current above zero.

In embodiments of the present invention the current can be ensured to remain above an undercurrent limit during the PWM off period. This may be achieved by applying a PWM off period with a maximum allowed value.

It is an advantage of embodiments of the present invention that the driving signal is a PWM driving signal. This may result in a motor driver which is more power efficient than a linear motor driver because in linear motor drivers energy is dissipated in the driver. Moreover, in the case of variable speed control a PWM driver is implying less overhead in the size of the driver and in the PCB construction, than in the case of a linear driver because in a linear solution dissipation of the heat generated inside the fan-driver must be supported.

In embodiments of the present invention the motor driver is adapted for controlling the PWM off time such that the PWM current through the at least one coil is always bigger than the undercurrent limit.

In embodiments of the present invention the PWM off time is selected short enough such that the PWM current through the at least one coil is always bigger than the undercurrent limit.

In embodiments of the present invention the PWM-off time may be pre-defined during manufacturing of the motor driver. In embodiments of the present invention this may be achieved by an integrated oscillator, or by deriving the PWM information during a manufacturing step.

In embodiments of the present invention the PWM-off time may be obtained by calibration.

In embodiments of the present invention the motor driver is adapted for modulating the PWM period.

It is an advantage of embodiments of the present invention that the PWM period can be modified (e.g. in function of the desired speed of the motor and/or in function of the supply voltage). At the same time the PWM off time is short enough such that the PWM current through the at least one coil is always bigger than the undercurrent limit.

In embodiments of the present invention the at least one coil has a time constant L/R which is less than 10 µs, wherein L is indicative for the inductance of the at least one coil, and R is indicative for the resistance of the at least one coil.

In embodiments of the present invention the time constant L/R is between 0.1 µs and 10 µs.

Motors may have a time constant L/R smaller than 0.5 µs. The L/R may for example go down to 0.1 µs. These motors require switching frequencies which for example can be achieved using GaN technology.

In embodiments of the present invention the at least one coil has a time constant L/R which is less than 2.5 µs, and wherein the PWM signal has a PWM off time less than 4 times the time constant of the brushless DC motor.

It is an advantage of embodiments of the present invention that it allows to reduce the torque ripple and thus mechanic vibrations as well as the connected audible noise, which are generated when PWM driving a low inductance BLDC motor by reducing the PWM OFF time of a PWM period such that is less than 4 times, or even less than 3 times the time constant of the BLDC motor. In embodiments of the present invention the PWM off time is between 0.1 and 4 times the time constant of the BLDC motor.

It is an advantage of embodiments of the present invention that the PWM OFF time of a PWM period is selected such that the current does not change sign or does not cross a pre-defined undercurrent limit within an electrical half period of the driving signal.

In embodiments of the present invention the PWM signal has a PWM period between 0.1 to 5 times the time constant of the brushless DC motor.

Logically the PWM off time is smaller than the PWM period. In embodiments of the present invention the PWM period may even be between 0.1 to 4 times the time constant of the al least one coil of the BLDC motor.

In embodiments of the present invention the inductance L and the resistance R are equal to the resistance and the inductance of the at least one coil.

In embodiments of the present invention the inductance L and the resistance R are equal to a total inductance and a total resistance, comprising the inductance and the resistance of the at least one coil and also comprising an inductance and resistance of a path between a motor terminal and the at least one coil.

In embodiments of the present invention the inductance and the resistance comprises the inductance and resistance of the at least one coil as well as the inductance and resistance of the bond wires of the BLDC motor driver, the PCB tracks, the connection points and the coils of the low inductance BLDC motor.

In embodiments of the present invention the control unit is adapted for adjusting and/or setting a maximum PWM off time and/or the pre-defined undercurrent limit and/or a maximum PWM period in function of a time constant L/R of the at least one coil of the brushless DC motor.

It is an advantage of embodiments of the present invention that the maximum PWM off time and/or the maximum PWM period and/or the predefined undercurrent limit can be set depending on the time constant L/R of the brushless DC motor. This can for example be done during manufacturing of the brushless DC motor driver or using a calibration procedure. In embodiments of the present invention the predefined undercurrent limit is adjusted or set such that it enables a maximum allowed PWM off time.

It is an advantage of embodiments of the present invention that the PWM off time and/or the PWM off period can be adjusted depending on the time constant L/R of the brushless DC motor. This allows to reduce the PWM frequency for different low inductance BLDC motors. This allows to deploy the motor driver for different low inductance BLDC motors.

In embodiments of the present invention the brushless DC motor driver is integrated in a semiconductor device.

In embodiments of the present invention the brushless DC motor driver comprises an oscillator integrated in the semiconductor device and connected with the control unit wherein the control unit is adapted to derive the PWM signal from the oscillator.

In embodiments of the present invention the brushless DC motor driver comprises a memory for storing PWM and/or current information, and the control unit is adapted for retrieving this PWM and/or current information and to derive the PWM signal using this information.

In embodiments of the present invention the brushless DC motor driver is adapted for storing the PWM off time and/or the PWM period in the memory.

In embodiments of the present invention the brushless DC motor driver is adapted for storing the pre-defined undercurrent limit.

In embodiments of the present invention the brushless DC motor driver moreover comprises a PWM pin for connecting an external component, and the control unit is adapted for retrieving PWM information from this pin when it is provided by the external component.

It is an advantage of embodiments of the present invention that the PWM signal (e.g. the PWM off time, the PWM period) can be modified through a PWM interface pin.

In embodiments of the present invention the brushless DC motor driver is configured for executing a calibration step for obtaining PWM information or current information for driving the brushless DC motor driver and for providing this information to the control unit.

It is an advantage of embodiments of the present invention that the PWM information or a predefined undercurrent limit can be obtained using a calibration procedure. This information can then be used by the control unit to generate a PWM signal. The PWM information may for example comprise the PWM off time, and the PWM period.

A motor system, according to embodiments of the present invention may comprise a brushless DC motor and a brushless DC motor driver according to embodiments of the present invention.

In embodiments of the present invention the brushless DC motor is a single coil brushless DC motor.

In embodiments of the present invention the motor system comprises at least one coil with a time constant L/R which is less than 10 µs, wherein L is indicative for the inductance of the at least one coil, and R is indicative for the resistance of the at least one coil.

In embodiments of the present invention the coil is realized as traces on a substrate.

In embodiments of the present invention the method comprises controlling the PWM signal such that a current through the at least one coil is always bigger than a pre-defined undercurrent limit.

In embodiments of the present invention the PWM off time is controlled such that the PWM current through the at least one coil is always bigger than the pre-defined undercurrent limit. It is an advantage of embodiments of the present invention that significant breaking of the motor is prevented by controlling the PWM signal such that the current does not go below an undercurrent limit.

In embodiments of the present invention the method comprises controlling the PWM off time such that the PWM current through the at least one coil is always bigger than the pre-defined undercurrent limit.

In embodiments of the present invention the method comprises modulating the PWM period.

In embodiments of the present invention the at least one coil has a time constant L/R which is less than 10 μs, wherein L is indicative for the inductance of the at least one coil, and R is indicative for the resistance of the at least one coil, wherein the controlling of the PWM driving signal implies applying the PWM signal such that it has a PWM off time between below 4 times the time constant of the brushless DC motor.

Particular and preferred aspects of the invention are set out in the accompanying independent and dependent claims. Features from the dependent claims may be combined with features of the independent claims and with features of other dependent claims as appropriate and not merely as explicitly set out in the claims.

These and other aspects of the invention will be apparent from and elucidated with reference to the embodiment(s) described hereinafter.

Figure 1:
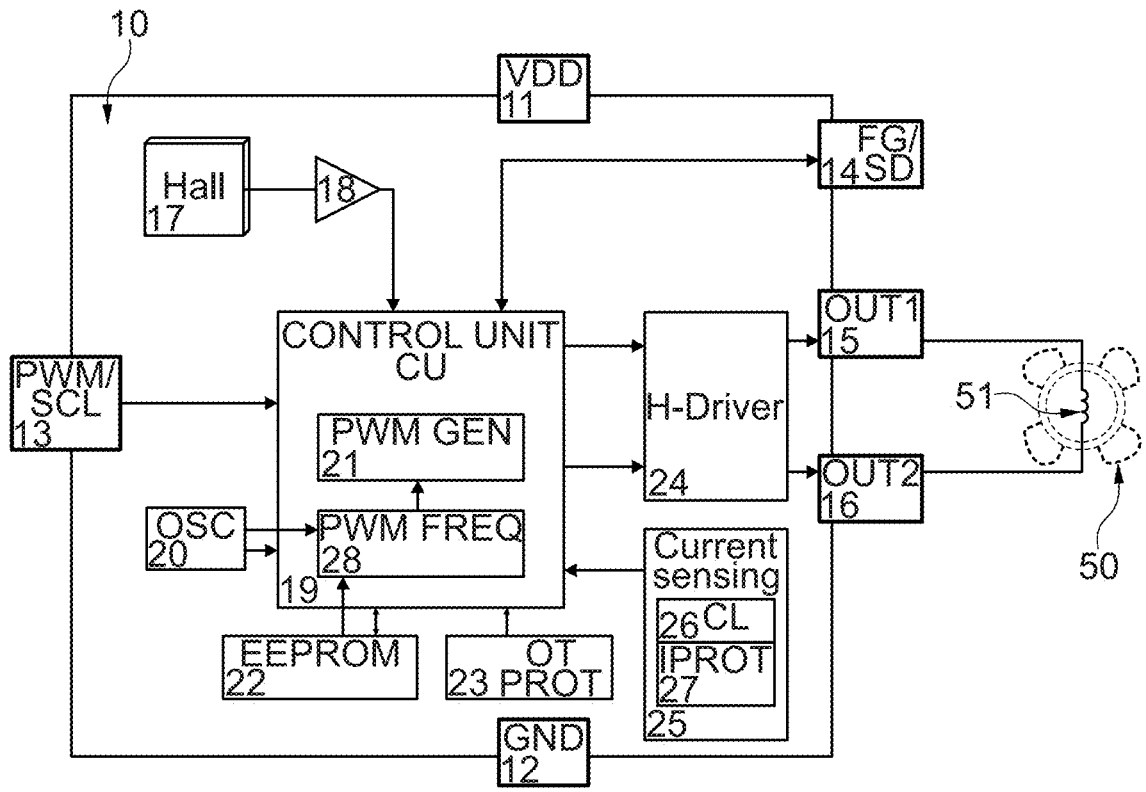
FIG. 1 shows a schematic drawing illustrating different components of a brushless DC motor driver and a motor system in accordance with embodiments of the present invention.

Any reference signs in the claims shall not be construed as limiting the scope.

In the different drawings, the same reference signs refer to the same or analogous elements.

DETAILED DESCRIPTION OF ILLUSTRATIVE EMBODIMENTS

The present invention will be described with respect to particular embodiments and with reference to certain drawings, but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to the driving signal, reference is made to the signal which generates a current through a coil of the BLDC motor. The current may be generated by an average voltage difference over the coil generated by the motor driver. In embodiments of the present invention the driving signal is a pulse width modulated (PWM) signal.

The average voltage difference across the motor coil in case of an embodiment with supply VDD, may be anywhere between 0V and VDD. The current scales up accordingly.

Figure 6:
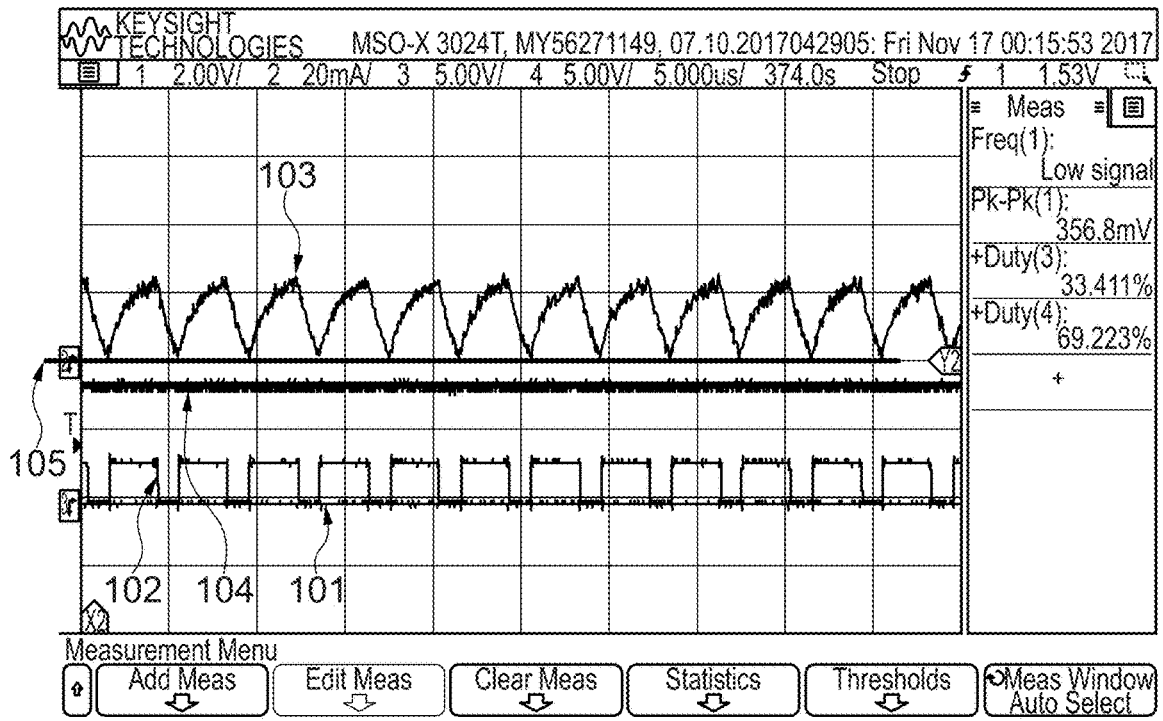
FIG. 6 shows a zoomed part of FIG. 5 during the driving period.

In a PWM driving method, the voltage is provided with a time interrupted way resulting in an average voltage difference over the coil. When neglecting resistive losses in the bridge driver and the motor coil of the single coil BLDC motor, the average voltage difference is 12V when driving the motor with a supply voltage VDD=12V and a DCout=100% PWM. With e.g. a DCout=50% PWM driving signal the average voltage difference is 6V over the coils. Also, when applying the PWM driving method, the phase current scales up accordingly, and can be represented at any time as Icoil(t)=(VDD*DCout(t)−BEMF(t))/Z, in which Z is the impedance of the bridge driver and the motor coil, and in which BEMF is the Back Electromotive Force induced into the coil by the rotating permanent magnets on the rotor. In order to maintain a given speed in case of a wide supply range, the average voltage difference over the coils can be kept constant by varying DCout according to VDD. For instance Dcout=70% at 3V, will correspond to DCout~23% at 9V, and DCout~13% at 16.5V as shown in FIG. 6, 8, 10. Such duty cycle can be adjusted for instance based on closed loop speed control, or by feedforward correction based on supply measurement, or a combination of both.

In a linear driving method, the average voltage difference is realized by adjusting the resistive losses in the bridge driver, and by dissipating the excess energy in the bridge driver. In particular for applications which have to operate at constant speed over a wide supply range, for instance from 3V up to 16V, the driver would have to dissipate at least 13V*Imotor for a nominal voltage of 13 V. Typical fandrivers can dissipate 0.5 W in order not to avoid overheating of the fandriver and the motor. Therefore, the maximum Imotor<0.5 W/13V~38 mA. The maximum power for such application is then limited to the minimum supply voltage*Imax, or in this example 3V*38 mA-0.11 W. At 16V the efficiency is as low as 3V/16~18%. In other words, 82% of the energy is which is not acceptable. Therefore, for applications requiring a fixed speed over a wide voltage range Linear drive is typically not considered.

The current in the at least one coil determines the torque, that the BLDC motor provides at any given time. Depending on the mechanical load of the motor, in an open loop controlled system, the torque will develop to a given speed. In a closed loop system, the regulation loop will adjust the motor torque or the actual speed or the actual motor voltage in order to reach or maintain a target torque or target speed or the target motor voltage. The actual motor voltage thereby corresponds with the duty cycle times the supply voltage.

Independent of the driving signal with a given voltage difference over the coil and resulting current in the coil, in brushless DC motors, the motor must be commutated depending on the position of the rotor. In single coil BLDC motors, the current direction in the single coil must change its polarity under the use of a commutation method.

Where in embodiments of the present invention reference is made to an electrical half period (EHP), reference is made to a period of 180 electrical degrees, which is starting at the start of the rising slope of a driving signal and ends at the start of the rising slope of the next driving signal.

In a first aspect embodiments of the present invention relate to a brushless DC motor system, comprising a single coil brushless DC motor 50 and a driver 10 for driving the single coil brushless DC motor.

The brushless DC motor system has a maximum time constant $\tau_{max}$. Where in embodiments of the present invention reference is made to the time constant of the brushless DC motor system, reference is made to the time constant of the complete system comprising the coil and the motor driver.

The driver comprises a control unit 19 which is adapted for driving the brushless DC motor at a constant speed and/or at a variable speed by applying a PWM driving signal to the coil of the brushless DC motor with a PWM frequency larger than a ratio defined by a constant/$\tau_{max}$ wherein the ratio is such that a current through the coil is always bigger than a pre-defined undercurrent limit. In embodiments of the present invention the pre-defined undercurrent limit may be zero or substantially zero.

In embodiments of the present invention the control unit 19 is configured for adjusting the PWM frequency for a given duty cycle.

In embodiments of the present invention the brushless DC motor may have a time constant $\tau_{max}$ up to 200 µs, or even up to 400 µs.

In an exemplary embodiment of the present invention a fixed PWM frequency may be set before motor start up, which is high enough such that even at any worst case duty cycle no reverse current appears for the applied motor.

In embodiments of the present invention the constant may be in the range of 2 to 20. The PWM frequency may for example be larger than $6/\tau_{max}$ (e.g. larger than 30 kHz for taumax=200 μs), such that the phase current does not go in generator mode during the off time in a range of the applied duty cycles.

In embodiments of the present invention the toff period may be adjusted in an open loop way, for instance by adjusting/scaling the PWM frequency with the duty cycle, based on a predefined relationship between PWM frequency and duty cycle.

In embodiments of the present invention the control unit is configured for maintaining a constant PWM frequency until a predefined duty cycle of is reached and for decreasing the PWM frequency when the duty cycle increases from the predefined duty cycle upwards. The predefined duty cycle may for example be 50%. The invention is, however, not limited thereto. The predefined duty cycle may for example be between 45% and 55%. In embodiments of the present invention a fixed (highest) frequency may be used until a duty cycle DCout=50%. This fixed frequency may for example be retrieved from EEPROM, or programmed end of line, etc. The control unit may also define the frequency based on a measurement of the time constant of the brushless DC motor system prior to start up or during operation, using a look up table. Above the duty cycle DCout of 50% (or another limit) the PWM frequency may be gradually reduced as the DCout increases to 100%. At 100% the PWM frequency may further drop to the lowest applicable frequency from acoustic point of view, for instance 18 kHz or 20 kHz.

As such the PWM frequency may decrease with increasing duty cycle so as to minimize the switching losses at high duty cycles, and achieve maximum power possible at high duty cycles. Switching losses are less relevant at low power levels.

Alternatively, the increase in PWM frequency may be controlled with feedback from a current threshold comparison.

In embodiments of the present invention a duty cycle of the PWM driving signal may range between a predefined minimum DCMIN and a predefined maximum DCMAX.

The maximum duty cycle may be selected such that a maximum motor voltage is obtained. The motor voltage can be obtained by multiplying the duty cycle with the supply voltage.

When increasing the power of a brushless DC motor also the noise level is increasing. By avoiding generator motor currents or strongly reducing generator mode currents this noise level can be strongly decreased. As the noise level is the strongest for the higher power levels, in embodiments of the present invention, generator mode currents should be avoided for increased power ranges. In embodiments of the present invention the power range within which the current through the coil is always bigger than a pre-defined undercurrent limit, is defined by the limits DCMIN and DCMAX. For instance in applications where the duty cycle can vary from 10% to 100%, it may be enough to avoid generator mode current from 50% to 100%. While in applications where a duty cycle is applied in the range from 10% to 50%, it may be necessary to ensure no generator mode current in the range from 25% to 50%, or even from 10% to 50%.

Given that the motor voltage DCout*VDD=VBEMF+ Rtotal*Icoil. In embodiments of the present invention the resistive drop (Rtotal*Icoil) is smaller than 20% of the applied supply voltage at DCout=100%. Or still VBEMF>80%*VDD*DCout, implying a strong impact of the VBEMF on the current shape, and therefore the BEMF is strongly impacting the falling slope of the coil current, such as to cause a faster drop, such that the current of a 200 μs motor, drops faster than the coil current in a 50 μs motor without BEMF In embodiments of the present invention the brushless DC motor driver may be integrated in a semiconductor device.

In embodiments of the present invention the brushless DC motor system may comprise a memory (for example the EEPROM 22 in FIG. 1) for storing PWM and/or current information and/or information on the time constant τ of the motor system, and the control unit may adapted for retrieving this PWM and/or current information and to derive the PWM signal using this information.

In embodiments of the present invention the brushless DC motor system may, moreover, comprise a PWM pin for connecting an external component (such as a resistor or a capacitor), and the control unit may be adapted for retrieving PWM information from this pin when it is provided by the external component.

In embodiments of the present invention the brushless DC motor system may be configured for executing a calibration step for obtaining PWM information or current information for driving the brushless DC motor driver and for providing this information to the control unit.

Figure 18:
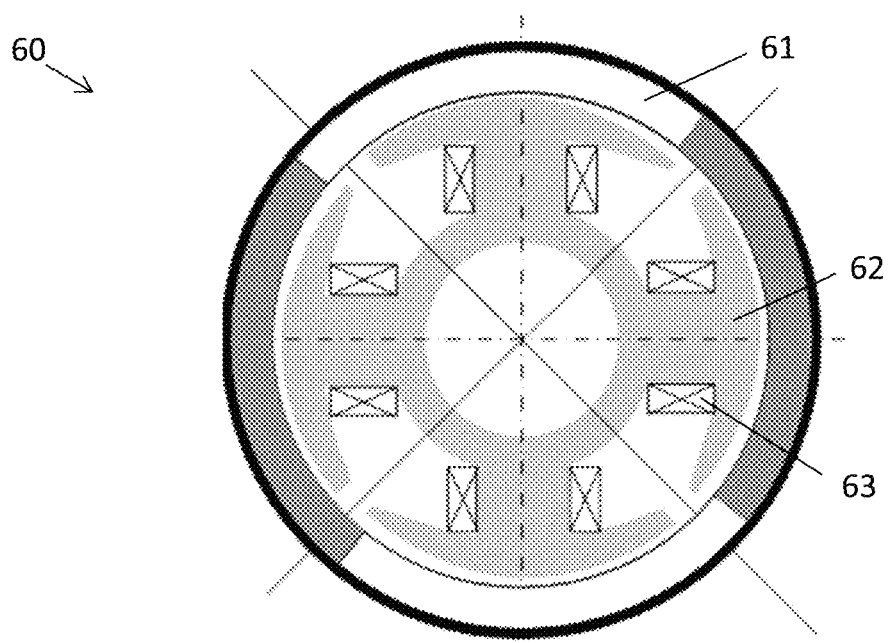
FIG. 18 shows a schematic drawing of a motor wherein the coil is realized as a wounded coil.

In embodiments of the present invention the coil may be realized as a wounded coil. In that case the coil is formed by winding an electrically conductive wire. Thus a motor with improved efficiency can be obtained. The electrically conductive wire may be wound on stator shoe poles. The stator shoe poles are realized as a laminated stack of iron. A schematic drawing of such a motor 60 is shown in FIG. 18. It shows the rotor 61, the stator 62 with magnets, and the windings 63.

In a second aspect embodiments of the present invention relate to a method for controlling a single coil brushless DC motor in a brushless DC motor system which has a maximum time constant $\tau_{max}$, the method comprising applying a PWM driving signal to the coil of the brushless DC motor with a PWM frequency larger than a ratio defined by a constant/$\tau_{max}$ wherein the ratio is such that a current through the coil is always bigger than a pre-defined undercurrent limit.

In some embodiments of the present invention the method may comprise controlling a PWM signal such that a current through the coil is always bigger than a pre-defined undercurrent limit by adjusting a PWM frequency for a given duty cycle.

In a method according to embodiments of the present invention the off period of the PWM driving signal may be adjusted based on a predefined relationship between the PWM frequency and the duty cycle.

In a closed loop method according to embodiments of the present invention triggering of a current limit threshold (e.g. generating a trigger when the current limit threshold is crossed by the coil current, the current limit threshold may for example be higher that the undercurrent limit) during an off period may be used as an input for increasing the PWM frequency.

It is noted that in practice applying variable frequency is rather unusual, as it complicates the logic of the control unit. Typically, if the design is capable to drive at a specific frequency (e.g. 50 kHz), then it will be running at 50 kHz in all conditions. Only in case of significant switching losses it could make sense to reduce the switching frequency. Based on the analysis done by the inventor and discussed in the following paragraphs, actually there is high chance that a possible generator mode will be strongest around DCout=50%, such that at higher driving duty cycles indeed the switching frequency could be slightly reduced, in order to reduce the switching losses, which are most critical at high currents, thus limiting the maximum mechanical power that can be applied to the fan blades or pump impeller at the highest duty cycle values below 100% (for instance 98% or 99%), and causing a bigger "jump" when further increasing to 100% (no more switching losses).

In specific motor constructions according to this invention, the motor efficiency is high, leading to a high BEMF ratio=VBEMF$_{maxspd}$/VDD, bigger than 70%, bigger than 80% or even bigger than 90%, or even as high as 95%. When applying a PWM duty cycle DCout=100% the motor reaches its max speed for a given supply voltage, assuming the motor load is constant. The BEMF voltage corresponding to this max speed can be referred to as VBEMF$_{maxspd}$.

Another way to represent the relation between VDD*DCout$_{max}$ and VBEMF$_{maxsp}$ is:

$$VDD*DCout_{max}-VBEMF_{maxspd}=R_{total}*I_{phase}$$

Such motors can have phase currents going into generator mode for τ as high as 400 μs for PWM frequencies as low as 15 kHz.

For motors with coils integrated as tracks on or in a substrate (e.g. a PCB) the motor efficiency may be lower than 70%. The proportionally lower VBEMF$_{maxspd}$/VDD*DCout$_{max}$ ratio, results in less impact of the BEMF voltage on the fall time of the phase current during toff period. Therefore the τ$_{max}$ at standstill needs to be lower compared to high efficient motors in order to cause generator mode currents. They still may have generator mode currents during PWM control, due to the very low τ, which may be lower than 50 μs.

Figure 14:
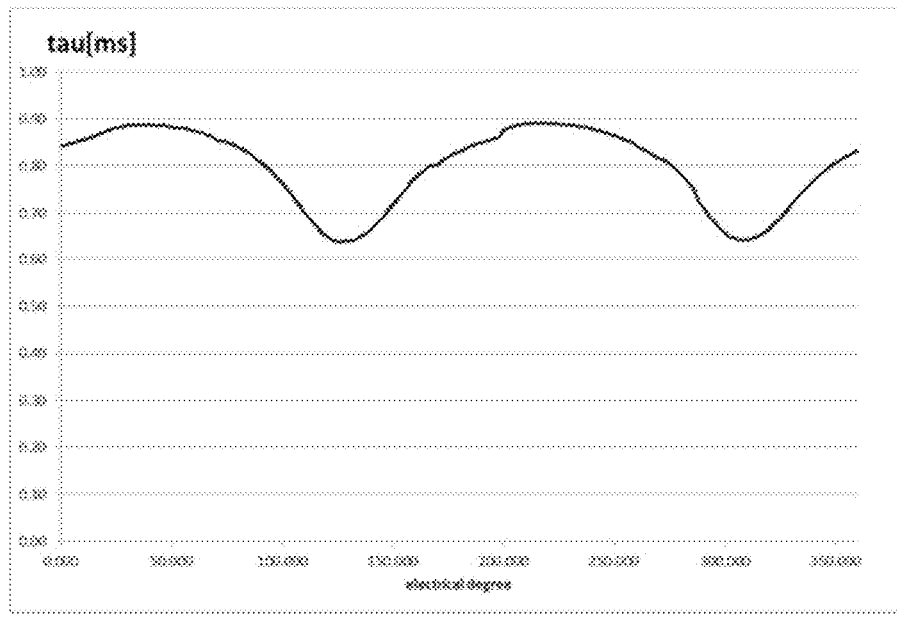
FIG. 14 shows the measurement result of the system time constant τ(x) of a motor system in accordance with embodiments of the present invention, as function of the electrical position of the rotor.

FIG. 14 shows the measurement result of the system time constant τ(x) of a motor system in accordance with embodiments of the present invention, as function of the electrical position of the rotor.

The time constant τ(x)=L(x)/R$_{total}$ is the system time constant at position x. In this equation:

L(x)=total system inductance at position x, typically the system inductance is defined by the motor coil inductance. Besides the motor coil also the bondwires to the motor coil have an inductance. They can be added to the motor coil inductance to obtain the total system inductance. This inductance is not depending on the rotor position. Typically the bondwire inductance is about 1 nH/mm. Assuming 4 bondwires in a half bridge of 1 mm, the bondwire inductance is about 4 nH. As the motor coil inductance may for example be about 1 mH, the bondwire inductance can be neglected in typical motor systems.

Rtotal=total system resistance, typically the total system resistance is defined by the motor coil resistance plus the motordriver resistance.

Linked to the typical motor construction of single coil motors, the minima of τ(x) coincide largely with the BEMF ZC points.

The constant τ0 is the value of the time constant τ at stand still. For single coil motors the stand still position is slightly offset from the BEMF ZC point in order to avoid stopping in the zero torque point. As such τ0 is always slightly higher than the minimum τ, but smaller than the maximum τ value. The maximum τ value τ$_{max}$ occurs in the middle of die electrical half period (EHP). The generator mode current will be most pronounced in positions x with low τ(x) and high VBEMF(x). The shape of the τ(x) is typically largely overlapping with the shape of VBEMF(x), but still some regions in the EHP may be more sensitive then others.

Figure 15:
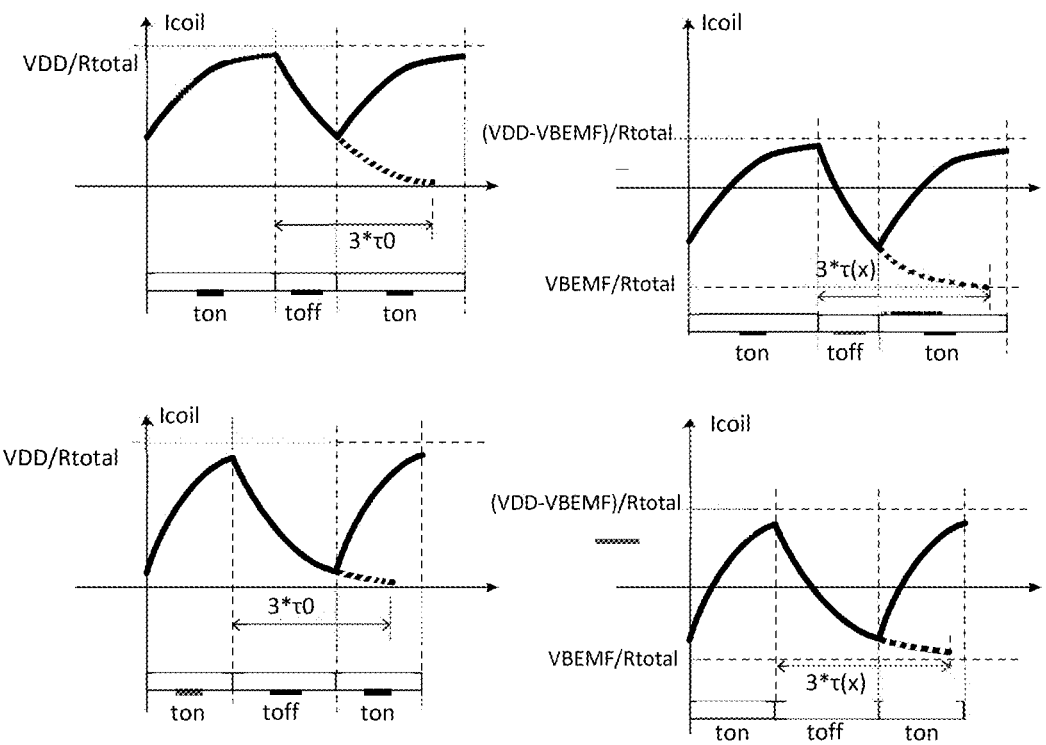
FIG. 15 shows the coil current in function of time for different duty cycles and for different VBEMF values.

FIG. 15 shows the coil current in function of time. For the top graphs the duty cycle DCout=70%. For the bottom graphs the duty cycle DCout=45%. For the left graphs VBEMF(0)=0 (locked rotor position) at stand still position (τ0). For the top right graph VBEMF(0)=0.65*VDD at a position with τ (x)>τ0. For the bottom right graph VBEMF=0.44*VDD at a position with τ(x)>τ0, for instance in the middle of the EHP.

Note that since the phase current typically increases quadratic with speed, and BEMF voltage only increase linear with speed, the motor efficiency drops with increasing motor speed, which results in a reduced BEMF ratio with increasing duty cycle. Motors with a BEMF ratio at max speed of 90%, may have a ratio of 95% at DCout=70%, and 98% at DCout=45.

In general the phase current can be simulated using below formula:

$$I_t = I_0 * e^{-1*\frac{R}{L}*t} + \left(\frac{E}{R}\right)*\left(1 - e^{-1*\frac{R}{L}*t}\right)$$

Which simplifies for the falling edge to (as the voltage over the coil F becomes−VBEMF):

$$I_t = I_0 * e^{-1*\frac{R}{L}*t} + \left(\frac{-VBEMF}{R}\right)*\left(1 - e^{-1*\frac{R}{L}*t}\right)$$

In which $I_0$ is the initial current at the end of the preceding rising edge (i.e. the current at the start of the $t_{off}$ period).

This shows that next to τ(x), and VBEMF(x), also $I_0$ defines if generator mode current is present. $I_0$ is the initial current at the start of the toff period. $I_0$ is defined by the $t_{on}$ time, the apply supply voltage, and the present VBEMF.

When applying a lead angle, the driving voltage waveform is leading the VBEMF shape. Such lead angle is applied to compensate for the lag effect caused by the coil inductance. This lag effect becomes particularly visible at highest motor currents, which is at highest DCout. In low end fandrivers the lead angle can not be adjusted during the operation, but is defined by the position of the hall sensor compared to the stator shoe poles.

Additional lead angle may be applied to further boost the motor maximum speed, at cost of efficiency.

Figure 16:
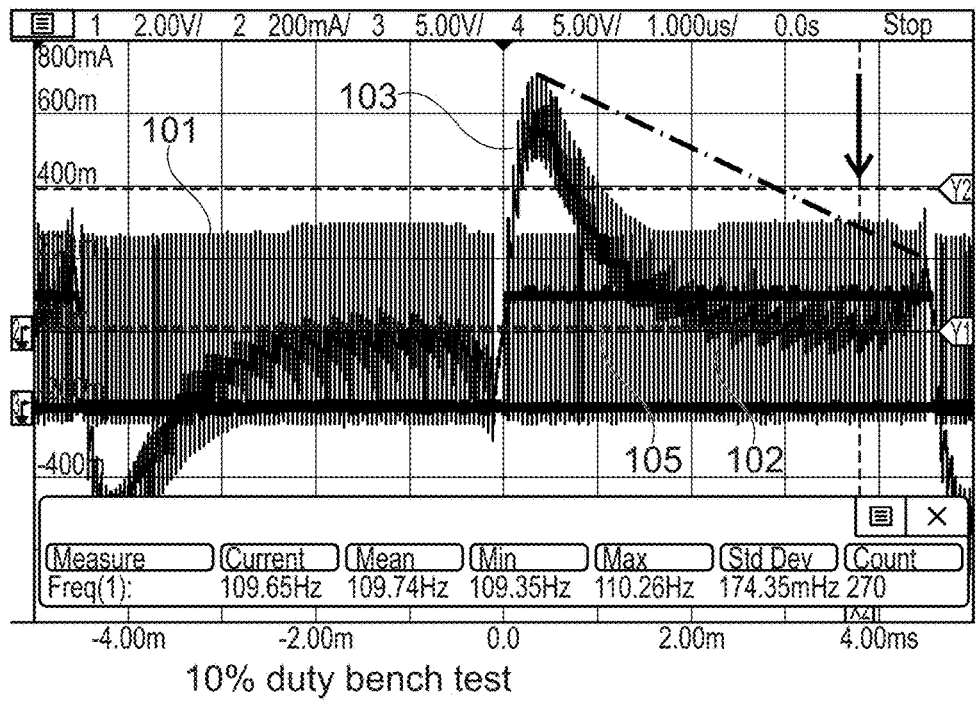
FIG. 16 shows actual measurements and simulation results, for duty cycles ranging from 10% to 40%, as obtained by the inventor.
Figure 16:
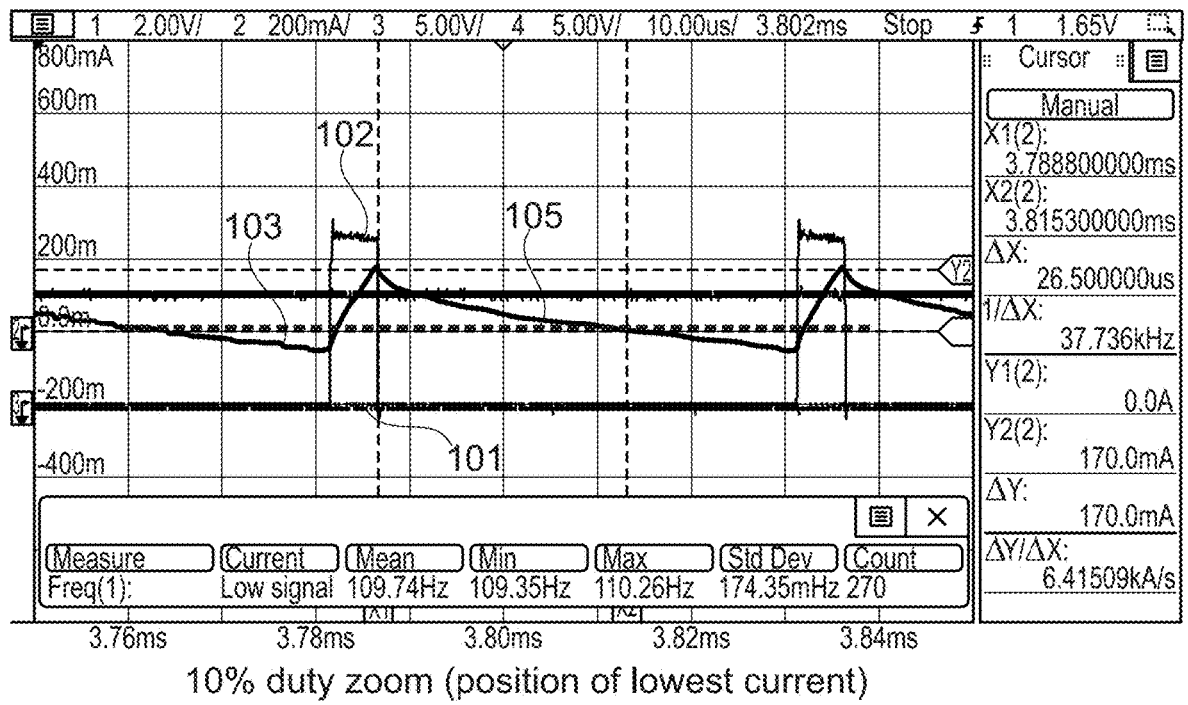
Figure 16:
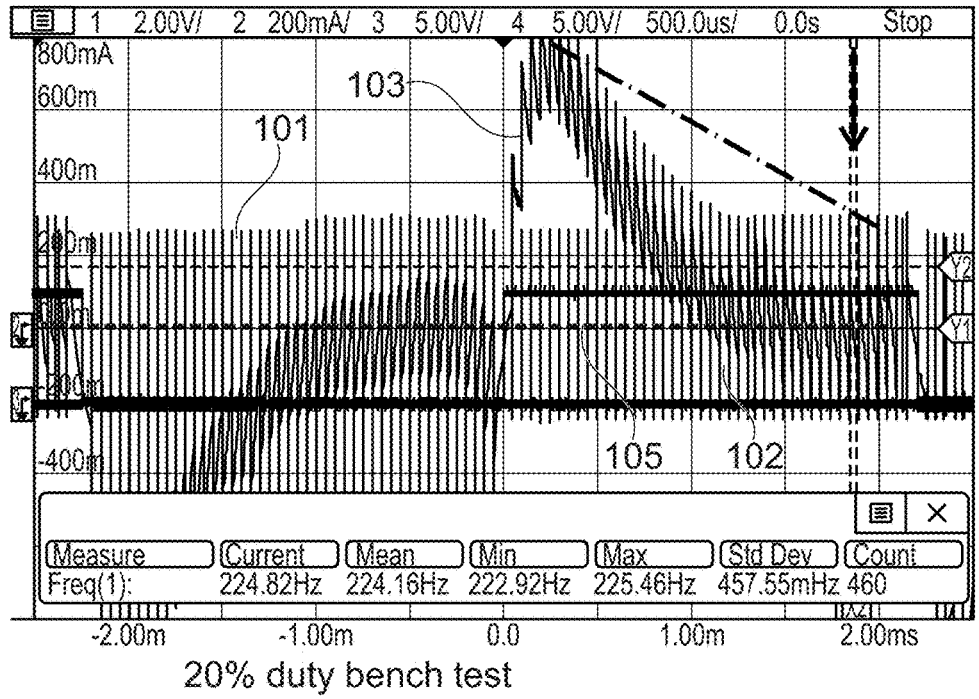
Figure 16:
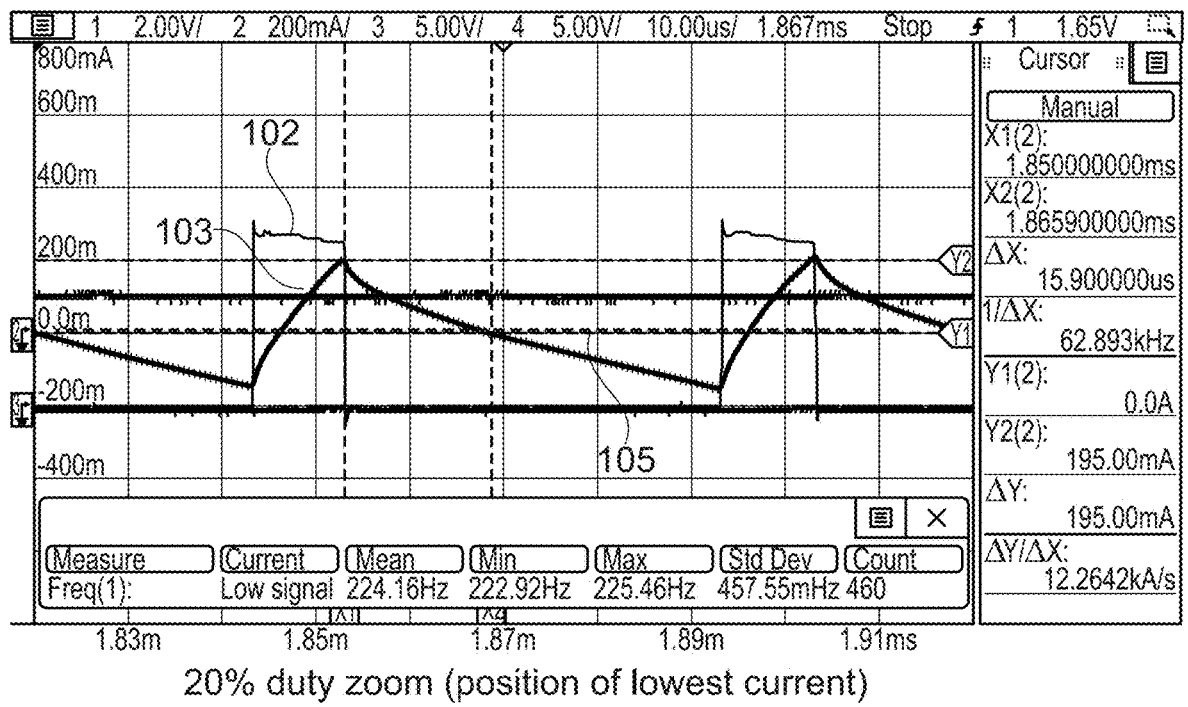
Figure 16:
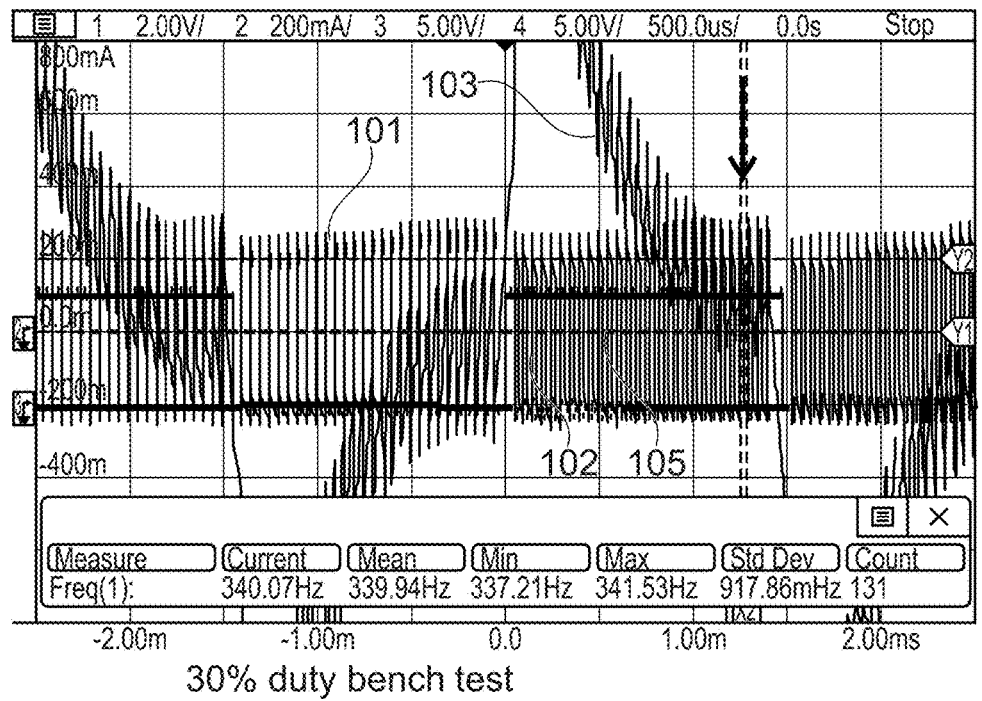
Figure 16:
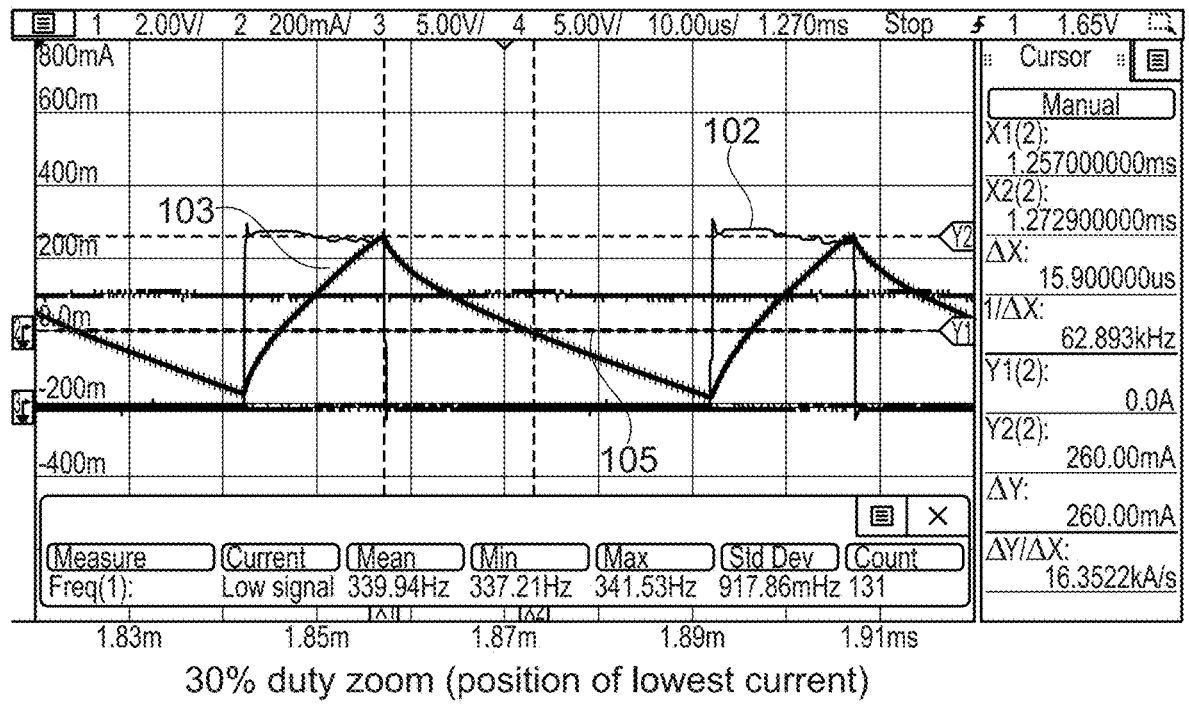
Figure 16:
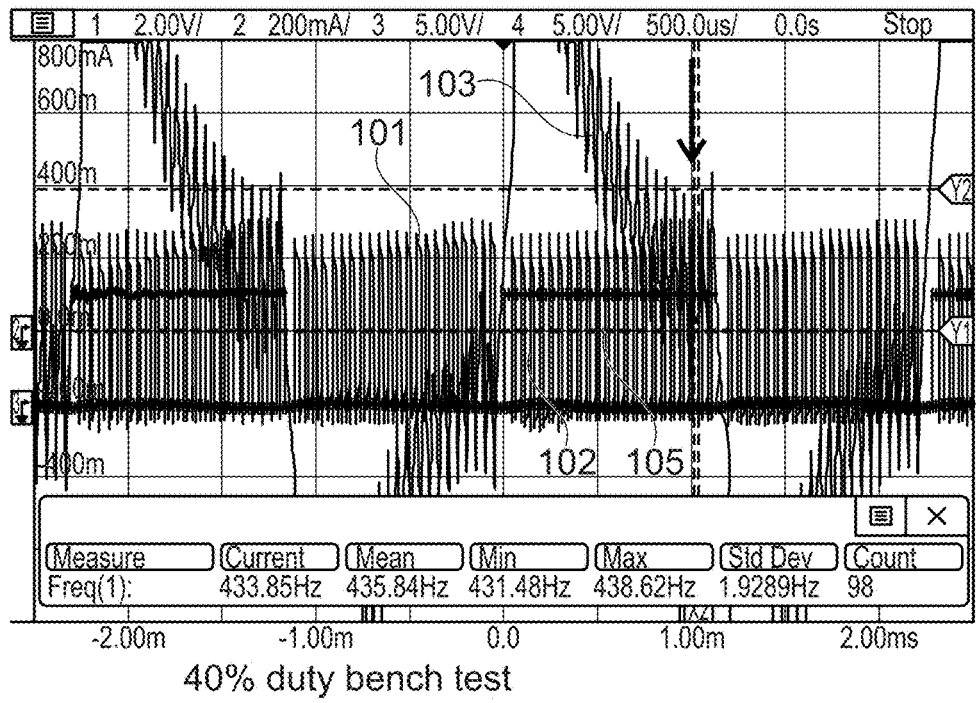
Figure 16:
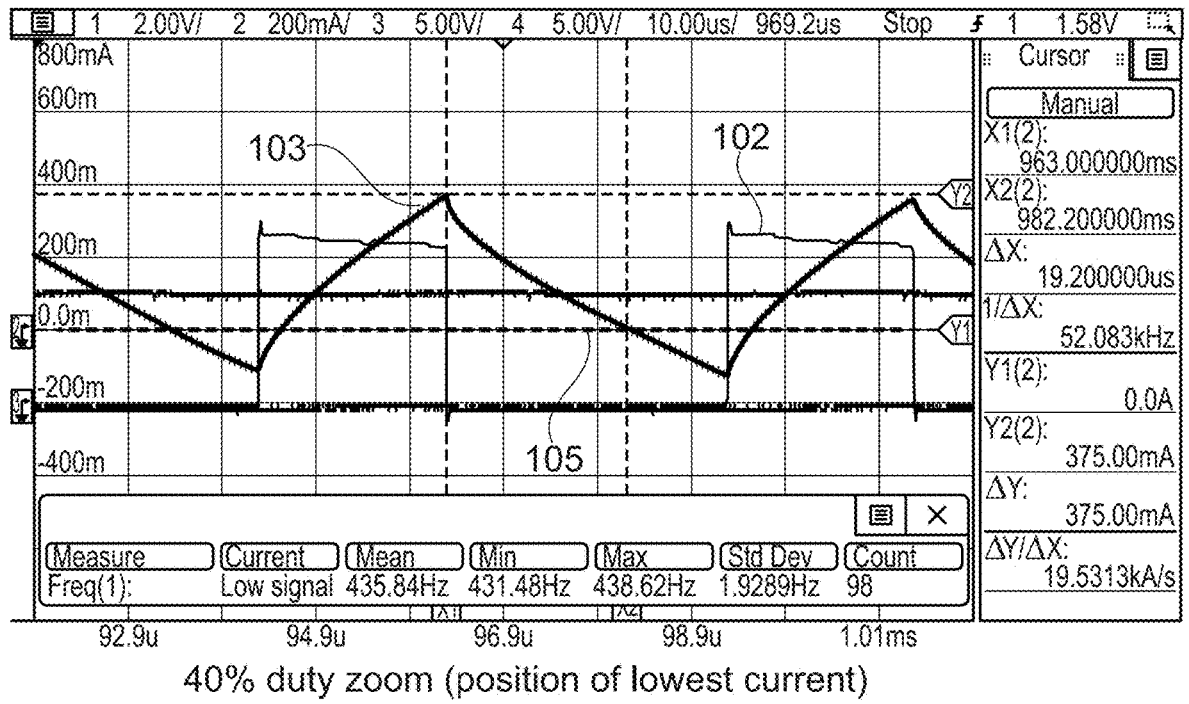

The indirect consequence of applying a fixed lead angle which is optimal for operation at high speed, is a large current overshoot at low speeds, leading to high $I_0$ during the first part of the EHP. For instance, as can be seen in FIG. 16, $I_0$ may be 3 or 4 times higher at 10% of the EHP, compared to the Jo at 89% of the same EHP. Such high current at low speeds may also accelerate the low inertia motors within one EHP. As such the VBEMF may exceed the applied motor voltage DCout*VDD at the end of the EHP, leading to BEMF ratios of more than 100%, even up to 110% and even 120%. The increase VBEMF not only makes the coil current drop faster during toff it also limits the rising slope during ton. Therefore motors with high lead angle have at the end of the EHP, lower to at the end of $t_{on}$, and have a faster drop of the current during $t_{off}$. Therefore motors with high lead angle are more susceptible to generator mode currents, which will typically occur in the second half of the EHP.

FIG. 16 shows actual measurements and simulation results for a motor with τ0=185 μs, driven with a large lead angle. The time constant τ0=L0/$R_{total}$, with L0=0.25 mH, and $R_{total}$=1.35 Ohm.

The graphs in FIG. 16 show the current for different duty cycles. From top to bottom the following duty cycles are applied: DCout=10%, 20%, 30% and 40%. The middle drawings show a zoomed in version of the left drawings at a position of the lowest current. The vertical arrows pointing down indicate the zoom point. The drawings show the phase current 103 going negative for the shown duty cycles.

Figure 17:
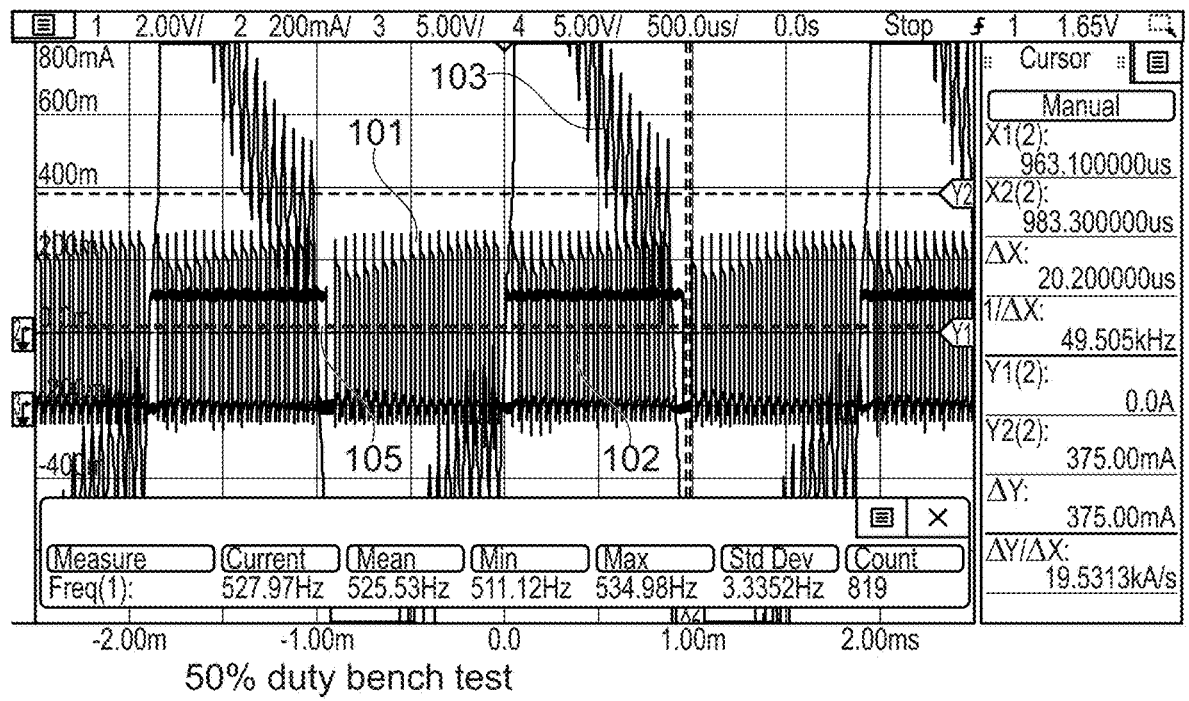
FIG. 17 shows actual measurements and simulation results, for duty cycles of 50% and 100%, as obtained by the inventor.
Figure 17:
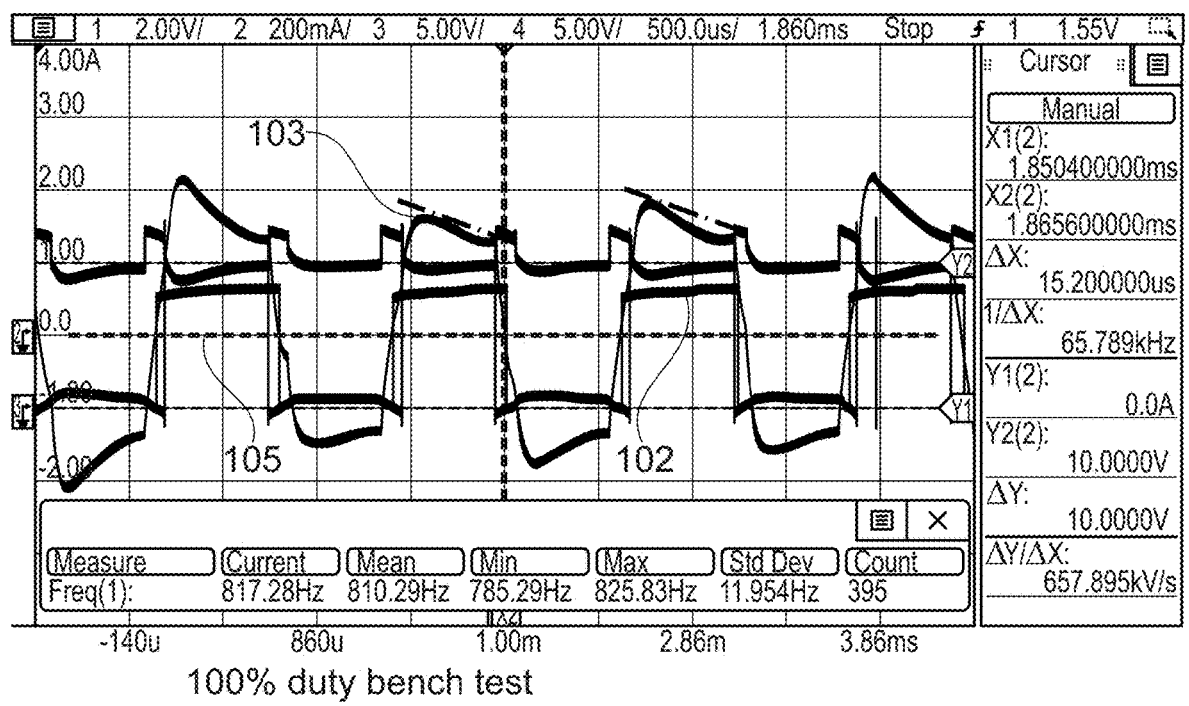

In FIGS. 16 and 17 the dashed horizontal line 105 shows a reference line for zero current. The traces 101 and 102 show the output voltages on the first (OUT1) and second (OUT2) motor terminal respectively. These traces illustrate the duty cycle.

The dashed dotted line in these figures illustrate the lead angle effect. This dashed dotted line illustrates that the current at the beginning of the EHP (e.g. at 10% of the EHP) is larger than the current at the end of the EHP (e.g. at 90% of the EHP). For a DCout of 10% the ratio between the maximum at the beginning of the EHP and the maximum at the end of the EHP may for example be 7. For a DCout of 90% the ratio between the maximum at the beginning of the EHP and the maximum at the end of the EHP may for example be between 1.2 and 1.3.

FIG. 17 shows actual measurements for duty cycles of 50% and 100%, revealing the current no longer drops below zero ampere. FIG. 17 also shows that the lead angle is much less visible at DCout=100%, reflecting that the lead angle effect is especially visible at lower DCout. At DCout=100% the coil current within one EHP is more flat. The initial peak is similar to the peak current at the end while at DCout=45% the initial peak is much higher than the end peak.

In FIGS. 16 and 17, a voltage VDD=10V has been applied, and a PWM frequency of 20 kHz. These conditions have been applied to simulate the behaviour of the falling phase current during $t_{off}$ using above formula. Below table shows the simulation results for the time to reach the current zero crossing. The simulations confirm the measured results.

The simulations were performed using the measured $I_0$ and the VBEMF calculated from the measured speed, and corrected (K) with an estimation of the lead angle acceleration inside the EHP.

$$Vbemf(calc) = \frac{spd}{\max spd} * K * VBEMF\max$$

The simulations confirm the measurement data of the current zero crossing point. It also confirms that for such a motor there is no more current zero crossing for DCout values higher than 50%.

From above table results, the needed fPWM can be calculated which is needed to further reduce the duty cycle at which the current zero crossing occurs during toff downwards from 50%. Thus, the PWM frequency for a given duty cycle can be adjusted such that a current through the coil is always bigger than a pre-defined undercurrent limit. For instance, the minimum PWM frequency (fPWMmin) in order to avoid current zero crossing in this example, can be obtained for the following different duty cycles as follows:

DCout=40%, is fPWMmin=20 kHz*30/19.2=31.3 kHz
DCout=30%, is fPWMmin=20 kHz*35/15.9=44.0 kHz
DCout=20%, is fPWMmin=20 kHz*40/15.9=50.3 kHz Referring to the example of FIG. 14, we may assume τ0~τ(x) at the end of the EHP which is the zone when generator mode currents are most present with high lead angle, as can be seen in FIG. 15.

For this motor, we can therefore conclude that no generator mode currents will flow as long as.

At DCout>40%, fPWMmin*τ0=31.3 kHz*185 us=5.8
At DCout>30%, fPWMmin*τ0=44.0 kHz*185 us=8.1
At DCout>20%, fPWMmin*τ0=50.3 kHz 185 us=9.3

Since the ratio τ0/τmax is fixed for any motor, a more generic statement is that for any motor a constant can be defined for which fPWMmin*τmax>constant ensures that above the desired Dcout value no generator mode current will be generated.

As shown in FIG. 14 a typical ratio τ0/τmax lies between 0.9 and 0.95. For the example in FIG. 15 this implies the constant fPWMmin*τmax should be 10 to ensure no generator mode current for Dcout>20%.

In most applications it is sufficient to avoid current zero crossing for Dcout>30%, or even >40%. For the example in

| | | | | | | |
|---|---|---|---|---|---|---|
| Vdd [V] | 10 | V | | | | |
| Idd @100% dc [A] | 1.2 | A | | | | |
| Full speed @100% [Hz] | 810 | Hz | | | | |
| VBEMFmax @100% [V] | 8.4 | V | | | | |
| τ0 [μs] | 185 | us | | | | |
| duty cycle | 10% | 20% | 30% | 40% | 50% | 100% |
| ton_pwm(μs) @20 kHz | 5 | 10 | 15 | 20 | 25 | 50 |
| toff_pwm(μs) @20 kHz | 45 | 40 | 35 | 30 | 25 | 0 |
| Speed(hz)(measured) [Hz] | 112 | 224 | 340 | 431 | 525 | 810 |
| $I_0$ (measured) (**) [A] | 0.170 | 0.195 | 0.260 | 0.375 | 0.450 | 1.200 |
| K = BEMF correction for LA (*) | 125% | 120% | 115% | 110% | 105% | 100% |
| Spd/maxspd | 13.8% | 27.7% | 42.0% | 53.2% | 65% | 100% |
| Vbemf(calc) [V] (**) | 1.45 | 2.79 | 4.05 | 4.92 | 5.72 | 8.40 |
| toff_zc [μs] (Measured) | 26.5 | 15.9 | 15.9 | 19.2 | n/a | n/a |
| toff_zc [μs] (Simulated) | 27.0 | 16.0 | 15.8 | 18.8 | n/a | n/a |
| FPWM no IZC [kHz] | 34.0 | 50.3 | 44.0 | 31.3 | | |
| tPWM no IZC [μs] | 29.4 | 19.9 | 22.7 | 32.0 | | |

(*) relative acceleration inside the EHP compared to average speed
(**) input for simulation FIG. 15 this implies a PWM frequency higher than ~8/τ0 and higher than ~6/τ0 respectively.

In embodiments of the present invention relate to a brushless DC motor driver 10 for driving a brushless DC motor 50 which comprises at least one coil 51.

In embodiments of the present invention the coil may for example have a time constant L/R between 0.1 and 10 us or even between 0.1 and 2.5 µs, wherein L is indicative for the inductance of the at least one coil, and R is indicative for the resistance of the at least one coil.

In embodiments of the present invention a maximum time constant at any angular position x over 360 electrical degrees may be smaller than 400 µs.

$$\tau_{max} = \frac{L_{max}}{R_{total}} < 200 \ \mu s$$

In this equation $L_{max}$ is indicative for the maximum inductance of the coil at any angular position x in the EHP and $R_{total}$ is indicative for the total resistance of the coil and motordriver.

Such motors may for example be used for fans which may be very small as either the available space is limited or as the application (e.g. in the field of gas sensing) does not require big gas streams or motor power. Such small fans might have a very low inductance. They may for example have a time constant L/R of about 1 µs. Also, in other applications low inductance brushless DC motors may be applied.

Higher time constants are more efficient. But due to space constraints efficiency may be sacrificed. For instance ultra-shallow fans can be realized using tracks on or in a substrate (e.g. a pcb). Or for axial fans with a small width, the stator should be as thin as possible to maximize the size of the fan blades, and therefore the amount of airflow. To minimize the stator size, thinnest wires are selected, leading to higher resistance values for a given L (for a given magnetic design the coil inductance is defined by nr of turns), and thus smallest L/R values. Additionally, winding coils with ultra-thin wires is difficult as the wires are prone to break. Coils realized as tracks on the PCB typically have L/R values around 1 µs.

To drive a BLDC motor with such a low time constant, a BLDC motor driver 10, in accordance with embodiments of the present invention, comprises a control unit 19 which is adapted for applying a PWM driving signal to the at least one coil of the brushless DC motor such that a current through the at least one coil is always bigger than a pre-defined undercurrent limit. In embodiments of the present invention this is achieved by adjusting a PWM frequency for a given duty cycle.

In embodiments of the present invention this is achieved by controlling the PWM off time such that the PWM current through the at least one coil is always bigger the undercurrent limit.

In embodiments of the present invention the at least one coil of the brushless DC motor has a time constant between 0.1 µs and 2.5 µs and the PWM signal which has a PWM off time <4 times the time constant of the brushless DC motor, to realize the target average motor voltage, or motor speed, regardless of the applied supply voltage. The PWM off time thereby corresponds to the duration in a PWM period during which the PWM signal is off. The PWM duty cycle, DCout, is realized by the ratio of the PWM off time divided by the total PWM period.

In embodiments of the present invention the PWM period may vary whilst keeping Toff constant or at least below 4 times the L/R time constant of the motor.

In other embodiments of the present invention the PWM period may be kept fixed independent of the output duty cycle required to achieve the target speed or average motor voltage. For instance, in applications with a minimum duty cycle DCoutmin=20%, and for L/R=1 us, the PWM period can be calculated as 3*1 us/80%-3.75 us. In other words, the constant PWM frequency should be at least 266 kHz, in order to ensure that the PWM off time remains smaller than 3*L/R down to DCout=20%.

It is an advantage of embodiments of the present invention that by applying the PWM off time less than 4 times the time constant of the brushless DC motor, the influence of the Back-Electro-Motive-Force (BEMF) in the PWM off periods to the motor current can be kept small, so that breaking effects in the generated torque can be kept small, so that a lower torque ripple and a lower acoustic noise can be achieved. In embodiments of the present invention the driving signal has PWM off time less than 4 times the time constant of the brushless DC motor in combination with a fixed PWM period or with a variable PWM in order to achieve a lower torque ripple and a lower acoustic noise.

The table below shows examples of PWM driving signals with a fixed frequency for a motor with L/R equal to 2.5 µs and with L/R equal to 1 µs. In this example PWM driving signals for which the PWM OFF period is above 4 times the time constant of the brushless DC motor (at the edge) result in negative currents through the coil which result in torque ripple and acoustic noise. It is clear that as Toff will exceed 3*L/R the braking force may initially still be limited, and therefore if this simplifies implementation, in corner conditions Toff could be slightly larger than 3*L/R (at the edge).

The table below was defined without taking into account the effect of BEMF in the falling edge and the rising edge. Therefore the continuation in part comprises a new table (the table a few pages earlier) which does take the effect of BEMF in the falling and rising edge into account.

|  | PWMperiod (freq) | DCout = 20% | DCout = 80% |
| --- | --- | --- | --- |
| L/R = 2.5 µs | 2.5 µs (400 kHz) | 2 µs OFF | 0.5 us OFF |
|  | 10 µs (100 kHz) | 8 µs OFF (at the edge) | 2 us OFF |
| L/R = 1 µs | 10 µs (100 kHz) | 8 us OFF (NOK) | 2 us OFF |
|  | 4 µs (250 kHz) | 3.2 us OFF (at the edge) | 0.8 us OFF |

In embodiments of the present invention the PWM off time is smaller than 4 times L/R and in cases even smaller than 3 times L/R.

In embodiments of the present invention the PWM off time is small enough such that the negative current through the coil is significantly reduced and hence also the breaking effect is significantly reduced.

In embodiments of the present invention the PWM off time is clamped to a predefined value (e.g. less than 4*L/R, for instance between 0.1*L/R and 3*L/R, for instance 0.19*L/R), while the on-time is varied to realize variable duty cycle, resulting in a variable frequency PWM.

In embodiments of the present invention such variable frequency PWM signal is controlled such that a negative phase current during the PWM off period in the active driving period is minimized or even completely avoided.

The current decay thereby depends on the PWM period and on the PWM duty cycle. For instance, for a BLDC motor with a constant speed, the duty cycle may be low (<20%) in case of a 16V supply, while the duty cycle may be high (>80%) in case of a 3V power supply.

For instance, assume a fan motor with L/R=1 us where the target speed is achieved at a supply voltage of 3V with a duty cycle of DCout=90%, or in case the target average voltage is 2.7V. This will imply that DCout should drop to 16.9% at a supply of 16V. In case the PWM off time is fixed at 3 us=3*L/R, then the PWM period will vary from 3 us/90% (300 kHz) to 3 us/16.9% (56 kHz), In embodiments of the present invention with a fixed PWM frequency the PWM frequency is for example between 100 and 2000 kHz, for example between 200 and 2000 kHz, for example 250 kHz.

In an exemplary embodiment of the present invention a brushless DC motor 50 with a very low inductance (e.g. with a time constant of approximately 1 μs) is driven with a significantly higher PWM frequency (e.g. 250 kHz) than is the case for prior art PWM drivers which apply typical PWM frequencies of for example between 15 kHz and 30 kHz.

FIG. 1 shows a schematic drawing of a brushless DC motor driver 10 in accordance with embodiments of the present invention. The figure shows a motor 50 which comprises a coil 51. The combination of the brushless DC motor driver 10 and the motor 50 is a motor system in accordance with embodiments of the present invention. In embodiments of the present invention the BLDC motor 50 may be a single coil BLDC motor.

In the example the BLDC motor driver 10 comprises a control unit 19 which is adapted for applying a PWM driving signal to the at least one coil of the brushless DC motor such that a current through the at least one coil is always bigger than a pre-defined undercurrent limit. The PWM off period may for example be small enough such that the PWM current through the at least one coil is always bigger the undercurrent limit. This may be smaller than 4 times the time constant of the brushless DC motor.

The motor driver may be an integrated circuit mounted on a PCB with the PCB mounted in the BLDC motor (e.g. the single coil BLDC motor).

In the exemplary embodiment of the present invention illustrated in FIG. 1, the BLDC motor is connected to the motor driver via two terminals 15, 16. The first terminal 15 (OUT1) is connected to motor terminal 1. The second terminal 16 (OUT2) is connected to motor terminal 2.

In the exemplary embodiment of the present invention illustrated in FIG. 1, the motor driver 10 comprises a serial clock data input 13 (SCL) and a bidirectional data input/output 14 (Serial Data SD). In this example, SCL and SD are connected to the control unit 19 (CU).

In the exemplary embodiment of the present invention illustrated in FIG. 1 the motor driver 10 moreover comprises a PWM input 13, which controls the motor (e.g. fan) operation. The PWM frequency may for example be controlled by an analog voltage level, or a resistive level or a current level, by a PWM frequency input, or by a PWM duty cycle input. The PWM input 13 may be configured such that speed/current/and torque target information can be passed to the BLDC motor driver. In any of these exemplary embodiments of the present invention the brushless DC motor driver, is configured, such that when driving the motor using the PWM driving signal the current in the at least one coil is always bigger than a pre-defined undercurrent limit.

In the exemplary embodiment of the present invention illustrated in FIG. 1 the motor driver 10 moreover comprises an FG (Frequency Generator) output 14.

In the exemplary embodiment of the present invention illustrated in FIG. 1 the motor driver 10 moreover comprises an oscillator 20 which is connected with the control unit 19 and which is adapted to provide a clock to the control unit. In embodiments of the present invention the control unit comprises a PWM frequency generator 28 and a PWM generator 21. The control unit 19 might provide this clock or a derived clock to the PWM frequency generator 28. The PWM frequency generator 28 might provide an adjustable PWM frequency to the PWM generator 21.

In embodiments of the present invention the brushless DC motor driver is adapted for executing a calibration step for obtaining PWM frequency information at initialization of the brushless DC motor driver and for providing this information to the control unit.

During the calibration step the inductance of a low inductance BLDC motor may be measured and a preferred PWM frequency (corresponding with a PWM period between 1 to 5 times the time constant of the BLDC motor) may be calculated and passed to the control unit.

The calibration step of the motor driver may comprise applying a serial clock on the serial clock data input 13 (SCL) and data on the bidirectional data input/output 14 (SD). In embodiments of the present invention the motor driver is configured for passing the received data to the control unit 19. The motor driver may comprise a nonvolatile memory 22. The received data may be stored in this nonvolatile memory. The memory might be for instance an EEPROM (electrically erasable programmable read-only memory), OTP (one time programmable) or any other programmable memory. The data itself might contain a frequency information for the PWM frequency generator.

In embodiments of the present invention the motor driver is configured such that in normal operation, e.g. after power up of the motor driver, the stored PWM information (e.g. PWM off time, PWM period) of the nonvolatile memory is transferred to the PWM frequency generator 28 and might be used as a PWM frequency of the PWM generator 21. The predefined undercurrent limit may also be stored in nonvolatile memory and may be transferred to current limit block 26.

In another embodiment of the present invention the motor driver may comprise a pin for connecting a motor control unit 29 for providing the PWM information (e.g. a maximum PWM off time) or for providing the predefined undercurrent limit. This can be for instance a resistor or a capacitor. In one embodiment, a resistor or capacitor can be part of a dedicated controllable RC-Oscillator of the BLDC motor driver. The dedicated RC-Oscillator might derive its frequency from the connected external component. The dedicated controllable RC-Oscillator might provide its frequency to the PWM frequency generator 28.

In a further embodiment the PWM generator 21 might derive a maximum allowed PWM off time setting or the control unit 19 might receive a predefined undercurrent limit from another connected external component to a pin in order to enable the motor current always to stay positive.

In another embodiment of the present invention the PWM frequency information or maximum PWM off time setting or predefined undercurrent limit are provided during a manufacturing step of the motor driver 10, so that these parameters are adjusted to a fixed value suitable for low inductive BLDC motors. Manufacturing steps can be any steps on what frequency relevant or timing components as for instance a resistor or a capacitor or an integrated RC oscillator get their values.

In embodiments of the present invention the used PWM frequency is related to an inductance L and a resistance R which are indicative for the inductance and resistance of a coil of the BLDC motor (which may be a single coil BLDC motor). In embodiments of the present invention L and R may correspond with the inductance and the resistance of the coil. In other embodiments L and R may correspond with the total inductance and the total resistance measured from the bonding pads of a motor driver integrated circuit. The total inductance and the total resistance are then a sum of all partial inductances and resistances of the bond wires, PCB tracks, motor terminals and the single coil BLDC motor.

L may for example be equal to the sum of Lcoil and Lparas in which Lparas is any parasitic inductance, for instance due to bondwires in the driver package etc.

R may for example be equal to the sum of Rcoil, RDSon, and Rparas in which RDSon is the half bridge resistance of the BLDC motor driver and Rparas is any parasitic resistance, for instance due to bondwires in the driver package etc.

In the exemplary embodiment of the BLDC motor driver illustrated in FIG. 1, the motor driver is powered by a VDD positive supply 11 and a GND ground supply 12. In this example the driver comprises a Hall element 17 for determining the rotor position. The output of the Hall element is amplified by an amplifier 18 of which the output is connected with the control unit 19. The driver also comprises a temperature sensor and an over temperature protection module 23 of which the output is connected with the control unit 19. The control unit is controlling a H-bridge driver 24. The driver in this example also comprises a current sensing unit 25 which itself comprises a current clamping unit 26 and a current protection unit 27. The current sensing unit is sensing the current in the bridge driver and the output of the current sensing unit is connected with the control unit.

In embodiments of the present invention the motor driver 10 may be integrated in a semiconductor device.

Figure 2:
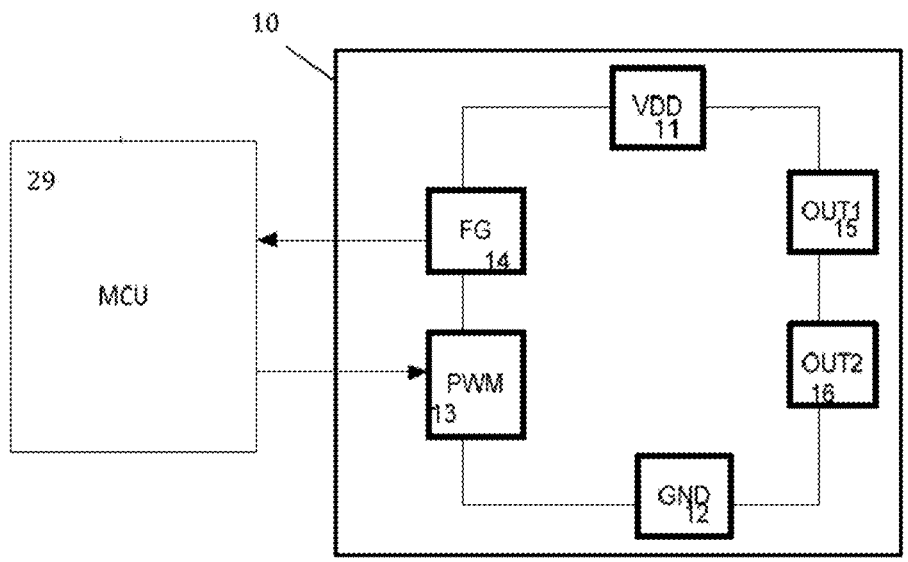
FIG. 2 shows a schematic drawing illustrating the control of a brushless DC motor driver in accordance with embodiments of the present invention using a motor control unit, according to embodiments of the present invention.

In embodiments of the present invention the motor driver is adapted for modulating the PWM period. Therefore, it may calculate the output duty cycle DCout. In embodiments of the present invention, the DCout can be calculated based on closed loop speed control. The closed loop speed control can be realized through a motor control unit (MCU) 29 using the FG and PWM communication interface pins. This MCU 29 is supplying PWM information to the PWM input pin. An example thereof is illustrated in FIG. 2. The FG output of the motor driver 10 provides the MCU 29 with speed information of the motor, allowing the MCU to adjust the PWM input duty cycle DCin to the motor driver. The motor driver 10 adjusts its output duty cycle the DCout, according to the provided DCin. Alternatively, the closed loop control can be realized without communication over FG and PWM interface pins. In such case the speed target can be fixed in non-volatile memory, or can be set using external components, such as resistors or capacitors.

In other embodiments of the present invention, the DCout can be calculated based on supply sensing. Such supply sensing can be realized using an ADC, or using multiple comparators which different voltage thresholds, for instance able to distinguish dedicated operating voltage values such as 3.0V, 4.2V, 8.4V, 16.8V, etc.

FIGS. 3 to 10 show graphs for a single coil BLDC motor that has a time constant L/R~1 μs.

Figure 3:
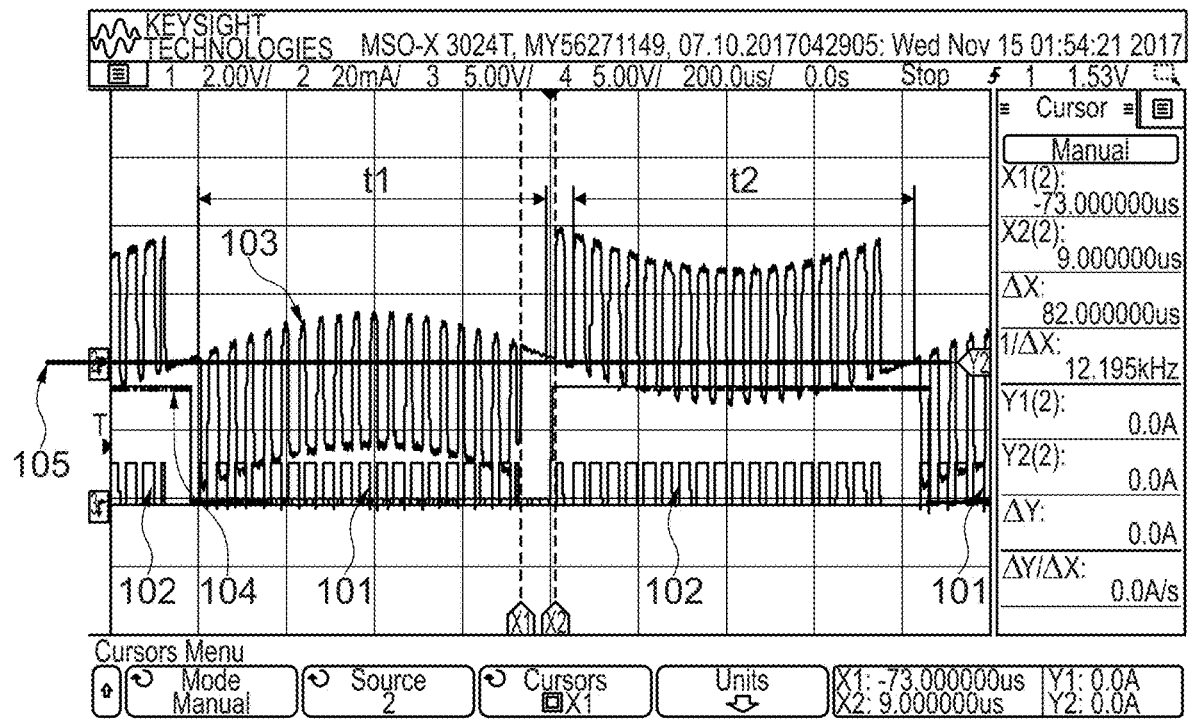
FIG. 3 shows possible prior art driving signals in function of time, wherein a low inductance BLDC motor is driven with a 25 kHz PWM frequency driving signal, using a 3.0V supply voltage.
Figure 4:
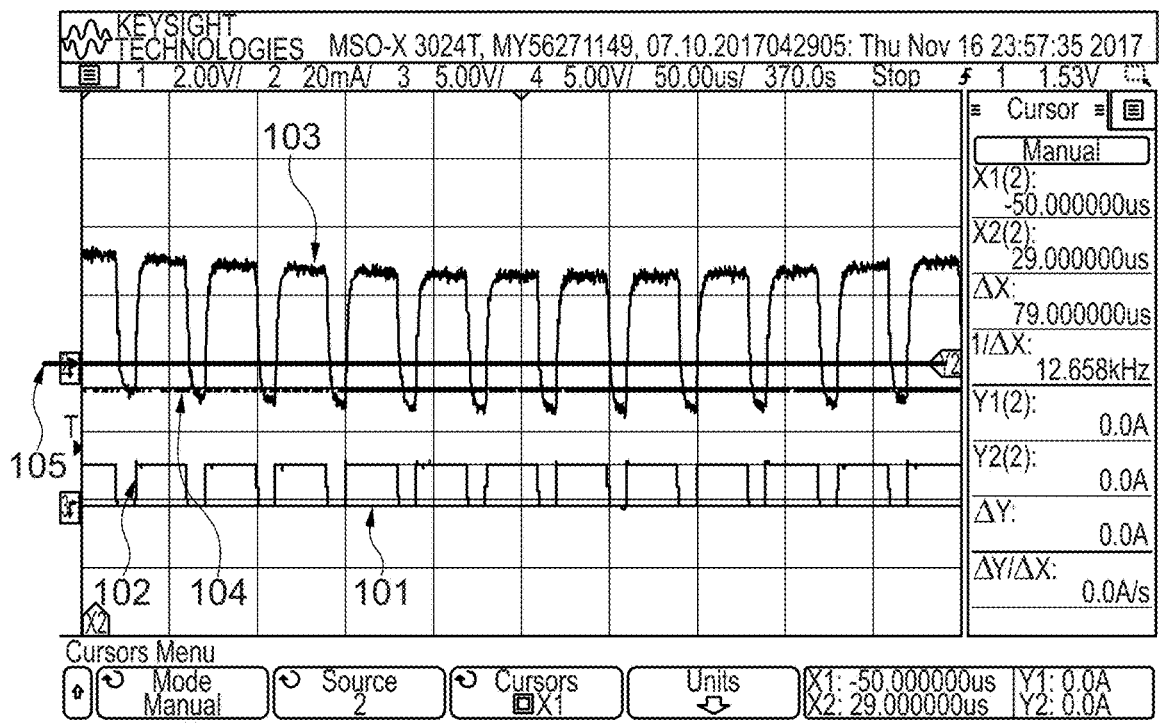
FIG. 4 shows a zoomed part of FIG. 3 wherein the target speed requires a about 70% duty cycle during the driving period.

FIG. 3 and FIG. 4 show possible prior art driving signals in function of time, when a low inductance BLDC motor is driven with a 25 kHz PWM frequency driving signal, at the target speed for VDD=3V.

In FIGS. 5 to 10 the PWM frequency is increased to 250 kHz, at the target speed with VDD=3V. In this example the PWM signal has a PWM off time which is substantially lower than 4 times the time constant of the brushless DC motor. The effect of this relationship between the low inductance motor driver and the applied PWM signal on the driver current is illustrated with FIGS. 3 to 10.

In these figures the traces 101 and 102 show the output voltages on OUT1 (Motor Terminal 1) and OUT2 (Motor Terminal 2). Trace 103 is the current in the single coil of the BLDC Motor. Trace 104 shows the FG-Signal, what is an indication of the motor commutation. Trace 105 is just a reference line for a current of zero.

It can be seen in FIG. 3 and FIG. 4 during the time intervals t1 and t2 which are each corresponding with an EHP, that during the PWM off periods the current has a negative component. During motor operation BEMF is produced. The BEMF is speed dependent. The BEMF generates the braking current, inverse to the applied motor current. In a turning motor (independent if the PWM has an ON or OFF period) the current should stay positive in order to enable a torque in a desired direction. As the current alternates between positive and negative, these alternating torque elements reduce the efficiency, and generate a strong torque ripple and thus audible noise.

In FIGS. 3, 5, 7 and 9 the BEMF shape can be clearly distinguished in the motor current, corresponding to Icoil(t) =(VDD*DCout(t)−BEMF(t))/Z. Since the coil inductance is low, the Icoil(t) is not averaged, and will follow the applied voltage shape according to the PWM duty cycle, with a transient depending on the L/R coil time constant.

FIG. 4 shows a zoomed scope plot of FIG. 3 during a driving period tdrive, for 3V at 25 kHz. At the selected target speed this corresponds to a DCout~70%. It can be clearly seen that during the ON time of the PWM period, the current is rising to reach a stable value~(VDD−BEMF)/Z.

while during the OFF time of the PWM period, the current is dropping to reach a stable value~(−BEMF)/Z.

Figure 5:
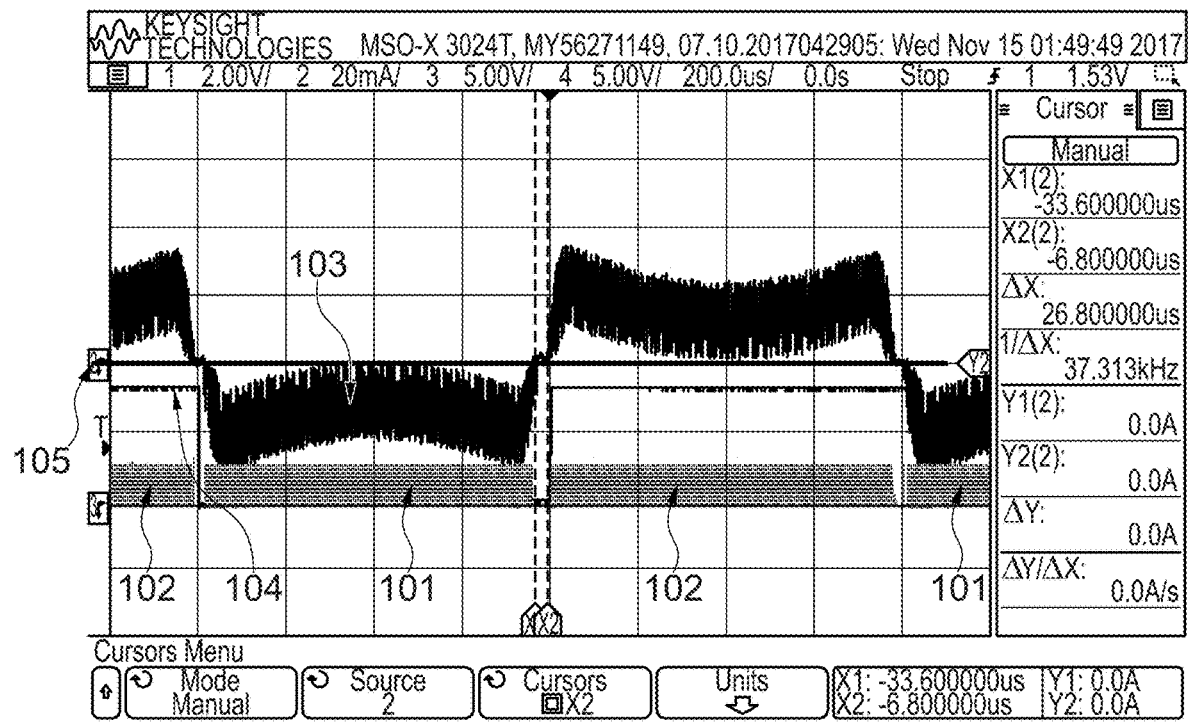
FIG. 5 shows a driving signal in function of time of a low inductance single coil BLDC motor which is driven with a 250 kHz PWM frequency driving signal in accordance with embodiments of the present invention, using a 3.0V supply voltage.

FIGS. 5 and 6 show the low inductance single coil BLDC motor with an increased PWM frequency of 250 kHz and a PWM off time less than 4 times the time constant of the coil of the motor. By applying such limited PWM off time, the influence of the BEMF can be reduced. This limits negative currents and torque ripples, that act inverse to the generating torque. This reduces the torque ripple, mechanic vibrations and audible noise.

FIG. 6 shows a zoomed scope plot of FIG. 5 during tdrive, for 3V at 250 kHz. The target speed requires a ~70% duty cycle during tdrive, corresponding to an average motor voltage Vmotor=Dcout*VDD~2.1V. The envelop of the current is very similar, reflecting the BEMF shape. However, in contrast to FIG. 3, in FIG. 5 the time constant L/R starts to limit the peak current values that can be achieved during the PWM ON and OFF period.

Figure 7:
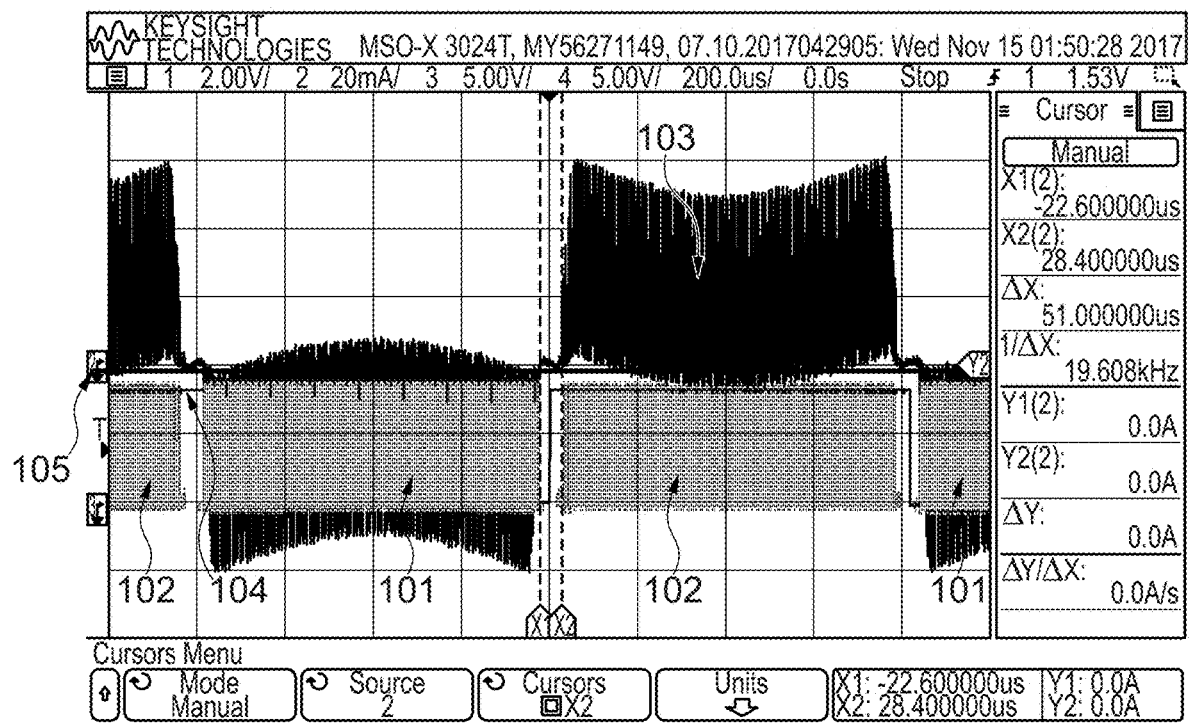
FIG. 7 shows driving signals in function of time, wherein a low inductance BLDC motor is driven with a 250 kHz PWM frequency driving signal in accordance with embodiments of the present invention, using a 9.0V supply voltage
Figure 8:
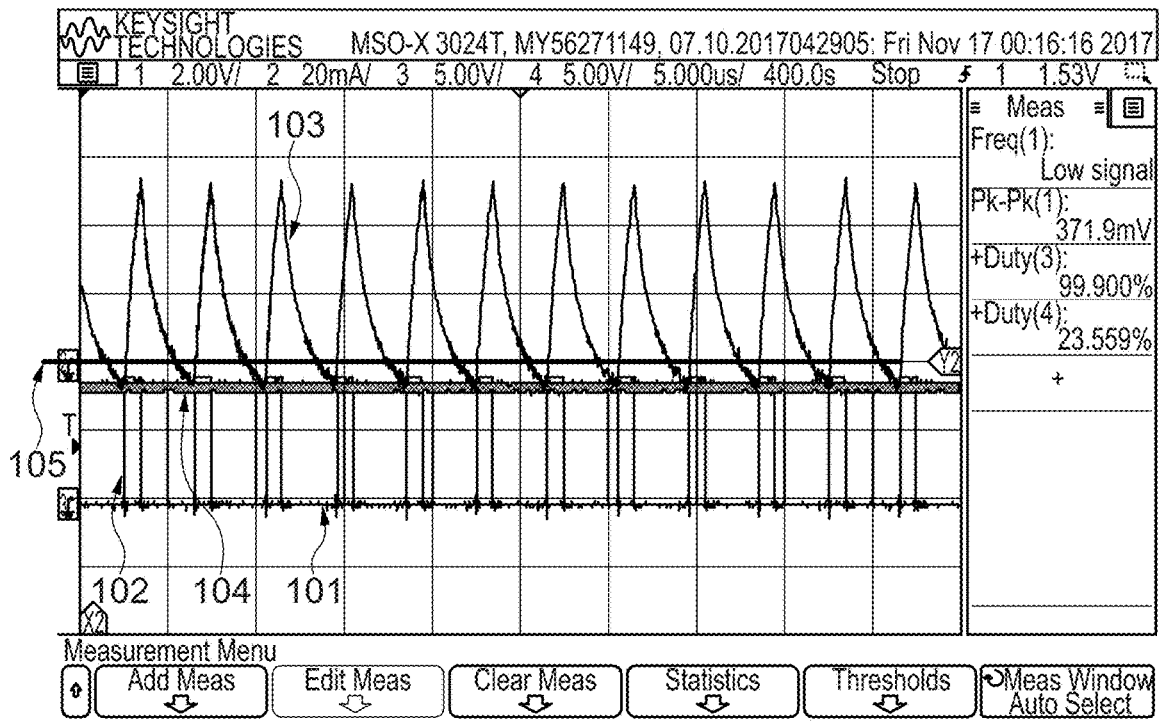
FIG. 8 shows a zoomed part of FIG. 7 during the driving period.
Figure 9:
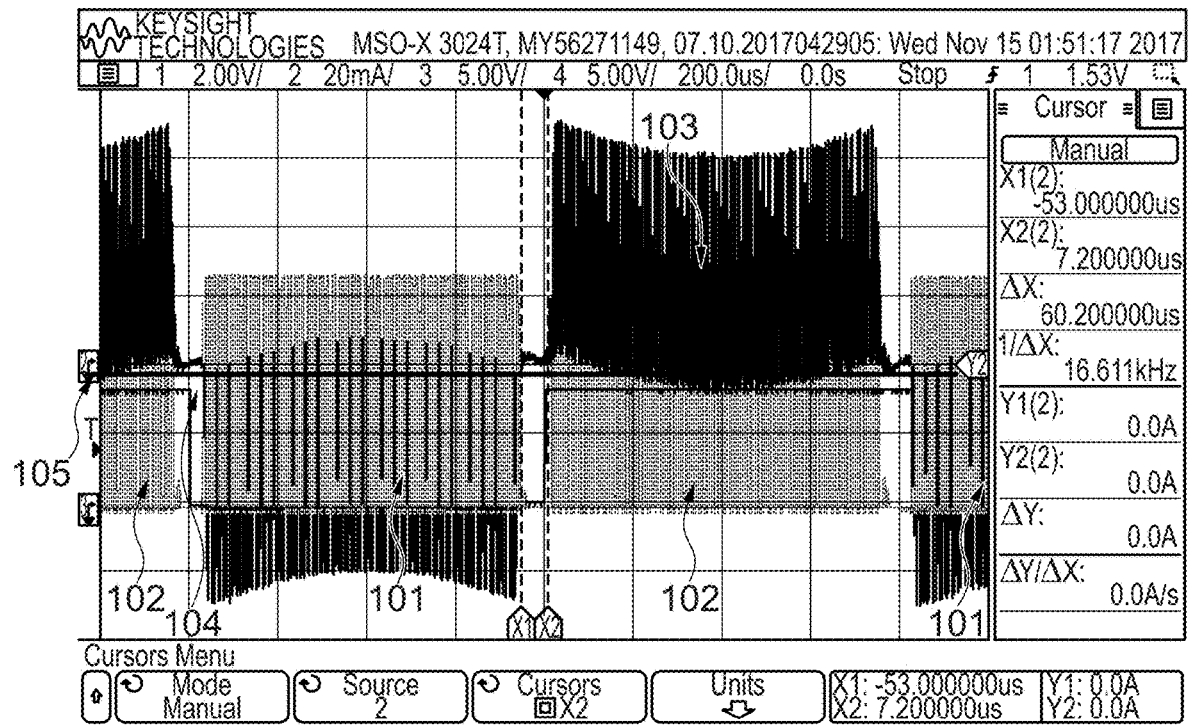
FIG. 9 shows driving signals in function of time, wherein a low inductance BLDC motor is driven with a 250 kHz PWM frequency driving signal in accordance with embodiments of the present invention, using a 16.5V supply voltage

FIG. 8 shows a zoomed part of FIG. 7 during tdrive. The target speed requires a ~23% duty cycle during tdrive, corresponding to Vmotor=Dcout*VDD~2.1V.

FIG. 8, 10 show similar current shapes for 9V and 16.5V at a fixed 250 kHz, but 23% and 13% DCout respectively.

Figure 10:
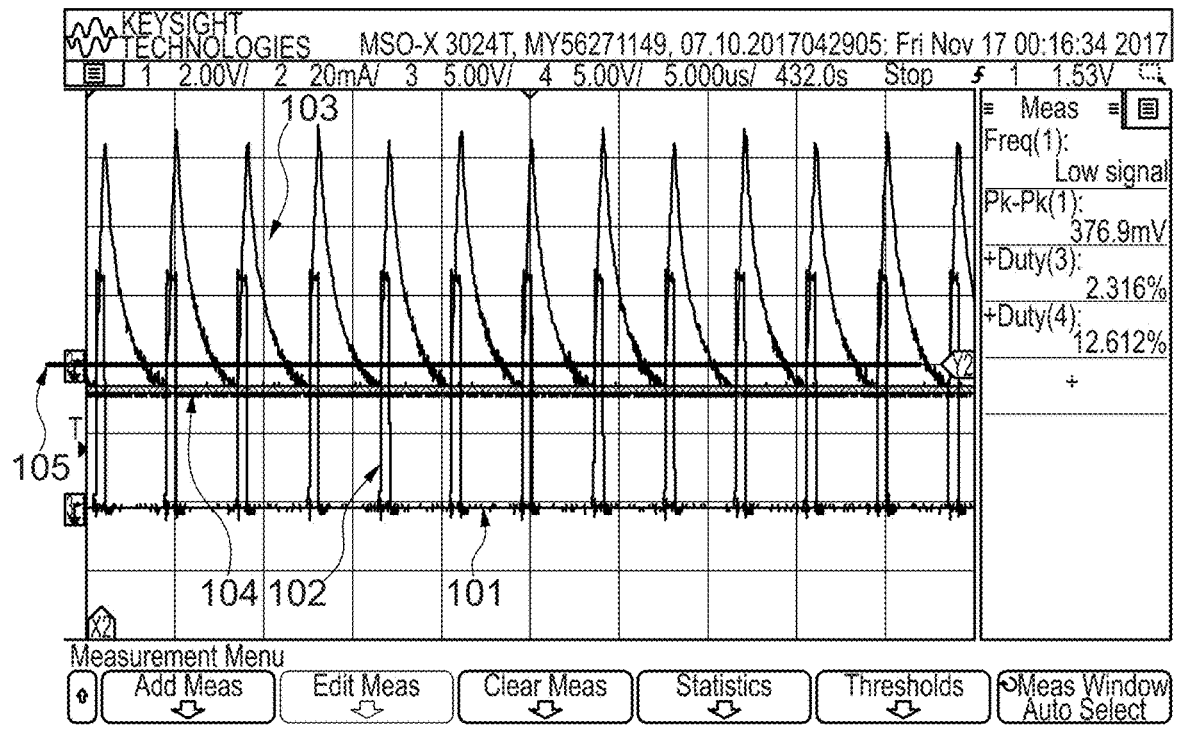
FIG. 10 shows a zoomed part of FIG. 9 during the driving period.

In FIG. 10 the target speed requires a ~13% duty cycle during the driving period tdrive, corresponding to Vmotor=Dcout*VDD~2.1V.

The higher OFF time is compensated by the higher peak current during the ON time, resulting in a similar minimum current value during the OFF time~0V. So, at 250 kHz the BEMF is not able to generate currents below an undercurrent limit. This undercurrent limit is substantially closer to zero than the negative currents in the example of FIG. 4. Negative currents lead to braking of the motor, and loss of efficiency, and increased audible noise. The zoomed FIGS. 8 and 10 shows there is no current below the undercurrent limit, similar to FIG. 5. In embodiments of the present invention a slightly negative undercurrent may still be allowable as long as it does not cause significant torque ripple resulting in mechanical vibrations.

Figure 11:
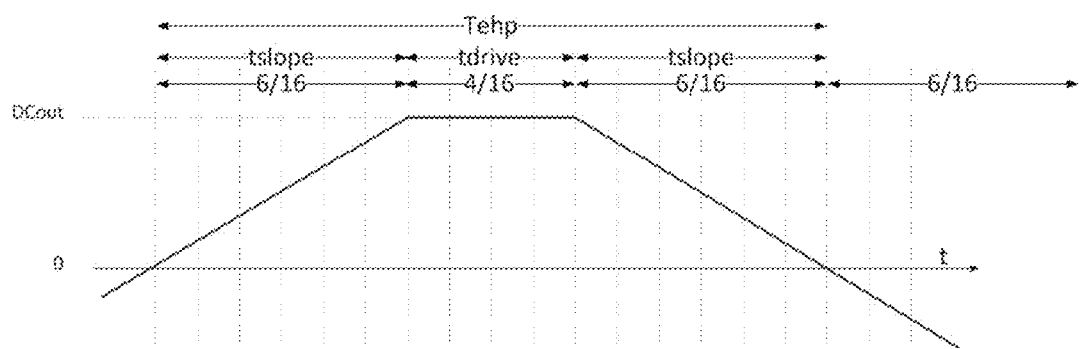
FIG. 11 shows a soft switching electrical half period for a motor commutation.
Figure 12:
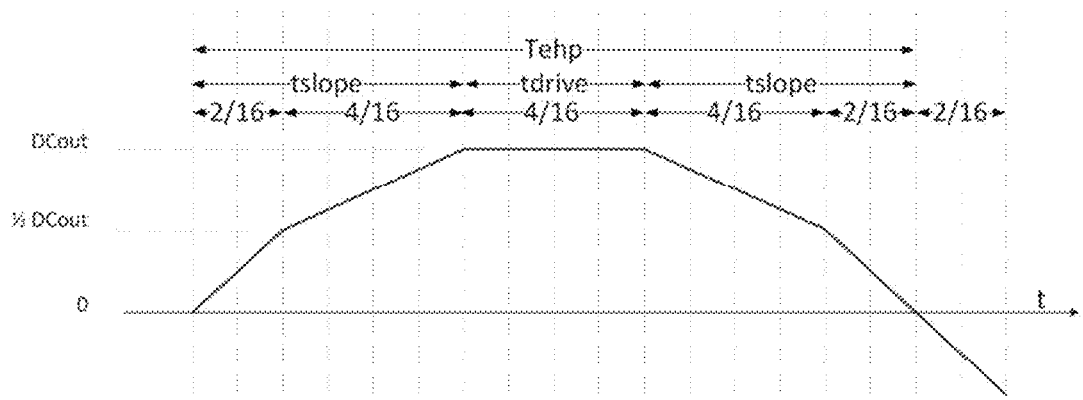
FIG. 12 shows a super soft switching electrical half period for a motor commutation.

In embodiments of the present invention the control unit may be adapted for generating a driving signal which has a soft switching shape or a super soft switching shape. FIG. 11 shows an example of a soft switching shape, FIG. 12 shows an example of a super soft switching shape. The difference is the slope of the voltage, that is applied during an electrical half period Tehp before and after a motor commutation. In soft switching the rising edge and the falling edge of the driving signal have a fixed slope such that the driving signal gradually rises to its maximum and gradually decreases to zero. In super soft switching the slope is not fixed but decreases at least once with an increasing driving signal and increases at least once with a decreasing driving signal.

In FIG. 11 the driving signal increases from zero to DCout over a period tslope which is 6/16 of the EHP, stays at its maximum DCout over a period tdrive which is 4/16 of the EHP, and decreases to zero over a period tslope which is 6/16 of the EHP.

In FIG. 12 the driving signal increases from 0 to DCout/2 over a first part of tslope which is 2/16 of the EHP, raises with a smaller slope to DCout over a second part of tslope which is 4/16 of the EHP, stays at its maximum DCout over a period tdrive which is 4/16 of the EHP, decreases to EHP over a first part of tslope which is 4/16 of the EHP, and decreases with a steeper slope over a second part of tslope which is 2/16 of the EHP.

In the table below experiments with different PWM frequencies, different supply voltages, and soft switching are summarized. The experiments are performed on a motor with time constant L/R=100 µH/100 Ohm~1 µs wherein L and R are the inductance and the resistance of the motor coil. The motor is, at a rotation speed of 12500 rpm, in a closed loop speed operation.

| PWM Frequency (kHz) | Voltage (V) | Current (mA) |
|---|---|---|
| 25 | 3.0 | 18 |
|  | 9.0 | 19 |
|  | 16.5 | 18 |
| 250 | 3.0 | 11 |
|  | 9.0 | 9 |
|  | 16.5 | 8 |

It can be seen, that the motor runs at the applied PWM frequency of 250 kHz at a lower motor current, thus with improved energy efficiency.

In embodiments of the present invention the BLDC motor driver 10 may be adapted for executing a calibration step leading to a self-calibration. For example, the BLDC motor driver might measure, the current in the PWM OFF periods. The measurement can for example be done using an ADC or using a comparator with a determined threshold value. During the calibration step, the BLDC motor driver might stepwise increase the PWM frequency in such a way, that the current in the PWM OFF time is not negative anymore. In that case the BLDC motor has no braking torque elements due to the influence of BEMF anymore, thus the motor is then running in an improved acoustic noise behavior and in a better energy efficient mode.

In another embodiment the maximum allowed PWM off time at a given supply voltage condition and at a given PWM frequency or the predefined undercurrent limit might be determined in a similar way.

The value of the PWM frequency or the maximum allowed PWM off time or the predefined undercurrent limit might be memorized in order to use it during application mode as previously described.

In embodiments of the present invention the BLDC motor driver may be adapted for executing this calibration only once at the end offline calibration or it may be adapted to execute this calibration during power up.

In embodiments of the present invention the BLDC motor driver may be adapted for determining the time constant of the motor L/R by applying a high frequency AC voltage, and by measuring the resulting phase lag in the current waveform.

The invention is, however, not limited to the above cited method for deriving the time constant of the low inductance BLDC motor and for adjusting the PWM frequency.

In embodiments of the present invention the motor may have a time constant L/R between 0.1 and 10 µs or even between 0.1 and 2.5 µs. In embodiments of the present invention the low inductance motor may be driving a blade. Such a fan may be a low inductance PCB type fans. These may be deployed in consumer as well as in automotive applications. Especially for Li-ion controlled portable devices, a very wide operating range is required which may range from 3V up to 21V. Such spans are extremely challenging to be covered through linear control.

It is therefore an advantage of embodiments of the present invention that these fans are driven using a brushless DC motor driver in accordance with embodiments of the present invention using an energy efficient PWM driving signal. It is advantageous that this invention provides a solution to allow such wide supply range.

Figure 13:
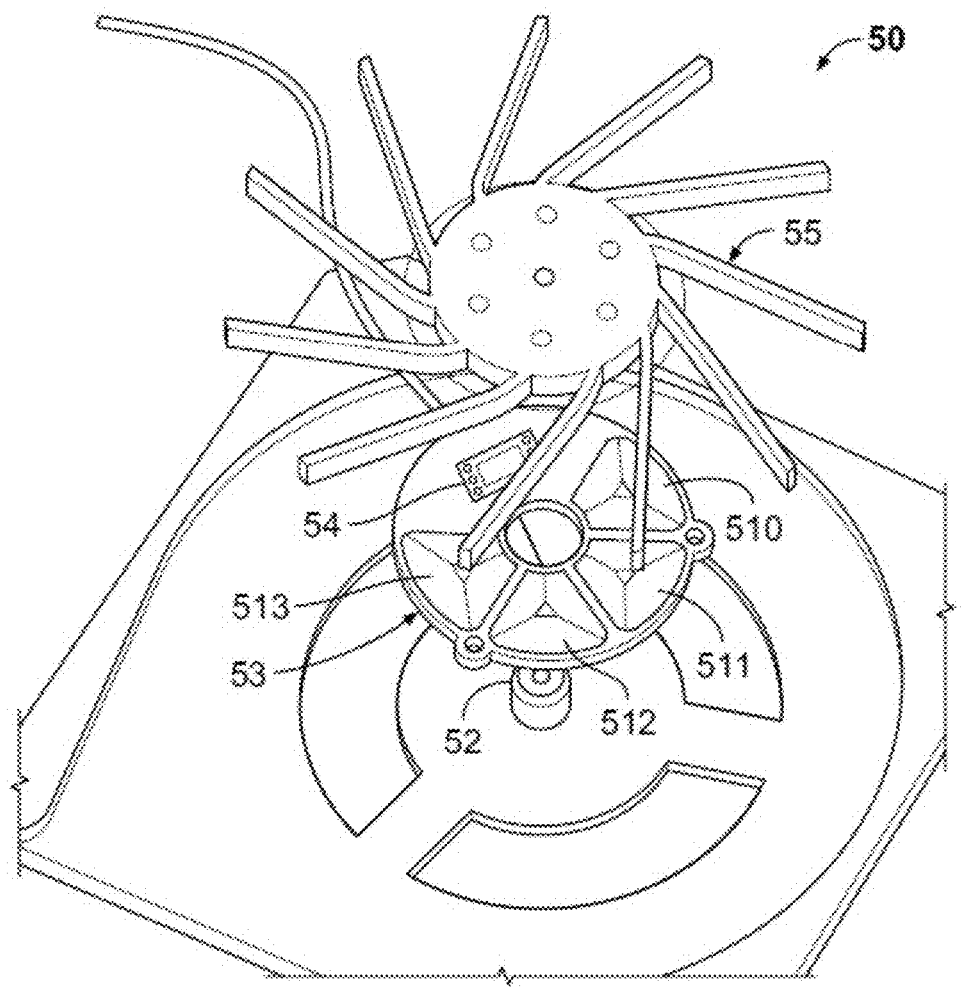
FIG. 13 shows an expanded view of a 1-coil fan with a low inductance coil which can be driven using a brushless DC motor driver in accordance with embodiments of the present invention.

A low inductance single coil BLDC motor might have different constructions as for instance a coil built up as wired copper or etched on a carrier. In one embodiment the carrier might be a FR4 PCB substrate as for instance shown in FIG. 13. This figure shows an expanded view example of 1-coil BLDC motor 50 with a low inductance coil as tracks on a PCB 53. The figure shows a first part 510, a second part 511, a third part 512 and a fourth part 513 of a single coil realized as a track on a PCB. The figure also shows a bearing 52, a PCB 53, a rotor 55 with magnets, fan blade, and a BLDC Motor driver 54 in accordance with embodiments of the present invention.

In embodiments of the present invention the method may comprise controlling the PWM signal such that a current through the at least one coil is always bigger than a predefined undercurrent limit. Thereby the PWM off period may be controlled such that the PWM current through the at least one coil is always bigger the undercurrent limit.

In embodiments of the present invention the method comprises a step wherein the PWM off time is decreased until a current through the coil is always bigger than a pre-defined undercurrent limit. This method is already discussed when describing the brushless DC motor driver.

In embodiments of the present invention the method comprises modulating the PWM period. In embodiments of the present invention the PWM on time may be modulated, while keeping the PWM off time small enough to avoid the current to go below the pre-defined undercurrent limit. This embodiment leads to a variable PWM frequency. At small DCout duty cycles, the PWM frequency will be higher than at high duty cycles. Such method can minimize the switching losses. Also, it allows to shape the switching slopes more accurately, since higher frequencies are applied during the slopes.

In embodiments of the present invention the method comprises driving a motor with a time constant L/R which is between 0.1 and 2.5 μs, wherein L is indicative for the inductance of the at least one coil, and R is indicative for the resistance of the at least one coil, the method comprises:

applying a driving signal to the at least one coil of the brushless DC motor wherein the driving signal is a PWM signal and wherein the PWM signal has a PWM period between 0.1 to 5 times, or even 0.1 to 4 times, the time constant of the brushless DC motor.

In embodiments of the present invention the method comprises a calibration method for obtaining the time constant L/R of at least one coil of the motor. These calibration methods are already discussed when describing the brushless DC motor driver.

The invention claimed is:

1. A brushless DC motor system, comprising a single coil brushless DC motor and a driver for driving the single coil brushless DC motor, wherein the brushless DC motor system has a maximum time constant $\tau_{max}$, the driver comprising a control unit which is adapted for driving the brushless DC motor at a constant speed and/or at a variable speed by applying a PWM driving signal to the coil of the brushless DC motor with a PWM frequency larger than a ratio defined by a constant/$\tau_{max}$ wherein the ratio is such that a current through the coil is always bigger than a pre-defined undercurrent limit.

2. The brushless DC motor system according to claim 1, wherein the constant is in a range of 2 to 20.

3. The brushless DC motor system according to claim 1, wherein the pre-defined undercurrent limit is substantially zero.

4. The brushless DC motor system according to claim 1, wherein the motor driver is configured for adjusting the PWM frequency for a given duty cycle.

5. The brushless DC motor system according to claim 1, wherein the control unit is configured for adjusting an off period of the PWM driving signal based on a predefined relationship between the PWM frequency and the duty cycle.

6. The brushless DC motor system according to claim 1, wherein the control unit is configured for maintaining a constant PWM frequency until a predefined duty cycle is reached and for decreasing the PWM frequency when the duty cycle increases from the predefined duty cycle upwards.

7. The brushless DC motor system according to claim 1, wherein the control unit is configured for adjusting the PWM frequency with feedback from a current threshold comparison.

8. The brushless DC motor system according to claim 1, wherein a duty cycle of the PWM driving signal ranges between a predefined minimum DCMIN and a predefined maximum DCMAX.

9. The brushless DC motor system according to claim 1, wherein the time constant $\tau_{max}$, is smaller than 400 μs.

10. The brushless DC motor system according to claim 1, wherein the brushless DC motor driver is integrated in a semiconductor device.

11. The brushless DC motor system according to claim 1, the brushless DC motor driver comprising a memory for storing PWM and/or current information, and wherein the control unit is adapted for retrieving this PWM and/or current information and to derive the PWM signal using this information.

12. The brushless DC motor system according to claim 1, configured for executing a calibration step for obtaining PWM information or current information for driving the brushless DC motor driver and for providing this information to the control unit.

13. The brushless DC motor system according to claim 1, wherein the coil is realized as a wounded coil.

14. A method for controlling a single coil brushless DC motor in a brushless DC motor system which has a maximum time constant $\tau_{max}$, the method comprising applying a PWM driving signal to the coil of the brushless DC motor with a PWM frequency larger than a ratio defined by a constant/$\tau_{max}$ wherein the ratio is such that a current through the coil is always bigger than a pre-defined undercurrent limit.

15. The method according to claim 14, the method comprising adjusting an off period of the PWM driving signal based on a predefined relationship between the PWM frequency and the duty cycle.

16. The method according to claim 14, wherein triggering of a current limit threshold during an off period of the PWM driving signal is used for increasing the PWM frequency.

* * * * *